United States Patent [19]

Kuroda et al.

[11] Patent Number: 5,445,987

[45] Date of Patent: Aug. 29, 1995

[54] METHOD OF MANUFACTURING A NONVOLATILE MEMORY INCLUDING A MEMORY CELL HAVING A MISFET

[75] Inventors: Kenichi Kuroda, Tachikawa; Masaaki Terasawa, Akishima; Kiyoshi Matsubara, Higashimurayama, all of Japan

[73] Assignees: Hitachi, Ltd.; Hitachi VLSI Engineering Corp., both of Tokyo, Japan

[21] Appl. No.: 98,779

[22] Filed: Jul. 29, 1993

[30] Foreign Application Priority Data

Aug. 5, 1992 [JP] Japan .................. 4-208337

[51] Int. Cl.⁶ ................ H01L 21/266; H01L 21/8247
[52] U.S. Cl. ...................... 437/43; 437/48; 437/978; 257/316
[58] Field of Search ............ 437/43, 978, 48, 49; 257/315, 316

[56] References Cited

U.S. PATENT DOCUMENTS

| | | | |
|---|---|---|---|
| 4,043,024 | 8/1977 | Iwamatsu | 29/571 |
| 4,420,871 | 12/1983 | Scheibe | 29/571 |
| 5,188,976 | 2/1993 | Kume et al. | 437/52 |
| 5,210,044 | 5/1993 | Yoshikawa | 437/43 |
| 5,296,396 | 3/1994 | Bellezza | 437/43 |
| 5,304,829 | 4/1994 | Mori et al. | 257/324 |

*Primary Examiner*—Olik Chaudhuri
*Assistant Examiner*—Richard A. Booth
*Attorney, Agent, or Firm*—Antonelli, Terry, Stout & Kraus

[57] ABSTRACT

A plurality of memory cells have their sources and drains formed integrally with n⁺-buried layers acting as first data lines in a semiconductor substrate. The n⁺-buried layers are connected with second data lines through transfer MISFETs. These transfer MISFETs have their gates made of the same layer of polycrystalline silicon as that of the floating gates of memory cells and are shunted at each predetermined number of bits by Al lines having a lower resistance than that of the polycrystalline silicon. The aforementioned memory cells are made by a method comprising the steps of: forming over a semiconductor substrate sequentially the first gate insulating film, a first conductor layer for the floating gate electrode, an insulating film having at least its uppermost layer of a silicon nitride film for the second gate insulating film, and a damage preventing film of a silicon oxide film; patterning the silicon oxide film, the insulating film and the first conductor layer in a stripe shape; and forming, by ion implantation, an n⁺-buried layer extending in a first direction by using the stripe-patterned silicon oxide film as a mask. As a result, the second gate insulating film can be prevented from having its quality degraded by the damage of the ion implantation.

13 Claims, 19 Drawing Sheets

FIG. 2

| | | BIT | | | | | | | |
|---|---|---|---|---|---|---|---|---|---|
| | | $A_0$ | $A_1$ | $A_2$ | $A_3$ | $A_4$ | $A_5$ | $A_6$ | $A_7$ |
| SEL (X-DEC) | $\bar{O}$ | H | L | H | L | H | L | H | L |
| | E | L | H | L | H | L | H | L | H |
| Y-SELECT (Y-DEC) | $y_0$ | H | L | L | L | L | L | L | L |
| | $y_1$ | L | L | H | L | L | L | L | L |
| | $y_2$ | L | L | L | L | H | L | L | L |
| | $y_3$ | L | L | L | L | L | L | H | L |
| SECOND DATA LINE | $D_0$ | H | | | | OPEN | | | |
| | $D_1$ | GND | H | | | | | | |
| | $D_2$ | | GND | H | | | | | |
| | $D_3$ | | OPEN | | GND | H | | | |
| | $D_4$ | | | | | | GND | | |
| DRAIN n+ BURIED LAYER | $d_0$ | H | H | | | | | | |
| | $d_1$ | GND | H | H | | OPEN | | | |
| | $d_2$ | GND | GND | H | H | | | | |
| | $d_3$ | | GND | GND | H | H | | | |
| | $d_4$ | | | GND | GND | H | H | | |
| | $d_5$ | | | | GND | GND | H | H | |
| | $d_6$ | | OPEN | | | GND | GND | H | H |
| | $d_7$ | | | | | | GND | GND | H |
| | $d_8$ | | | | | | | GND | GND |

FIG. 3

| ERASING METHOD | SELECTED BLOCK | UNSELECTED BLOCK |
|---|---|---|
| GATE NEGATIVE-BIAS METHOD | (A) Gate: $-V_{pp}$, Source: GND, Drain: GND, Substrate: GND <br> (B) Gate: $-V_{pp}$, Source: $V_{cc}$, Drain: $V_{cc}$, Substrate: GND | Gate: $V_{cc}$/GND/OPEN, Source: OPEN, Drain: OPEN, Substrate: GND |
| SUBSTRATE POSITIVE-BIAS METHOD | (C) Gate: GND (=0V), Source: $V_{pp}$, Drain: $V_{pp}$, Substrate: $V_{pp}$ <br> (D) Gate: GND, Source: $V_{pp}$, Drain: $V_{pp}$, Substrate: $V_{cc}$ | Gate: $V_{pp}$, Source: OPEN, Drain: OPEN, Substrate: $V_{pp}$ <br> Gate: $V_{cc}$/GND/OPEN, Source: OPEN, Drain: OPEN, Substrate: $V_{cc}$ |
| SOURCE/ BIAS METHOD | (E) Gate: GND, Source: $V_{pp}$, Drain: $V_{pp}$, Substrate: GND | Gate: $V_{cc}$/GND/OPEN, Source: OPEN, Drain: OPEN, Substrate: GND |

FIG. 9

| | | BIT | | | | | | | |
|---|---|---|---|---|---|---|---|---|---|
| | | $A_0$ | $A_1$ | $A_2$ | $A_3$ | $A_4$ | $A_5$ | $A_6$ | $A_7$ |
| SEL | $\overline{O}$ | H | L | H | L | H | L | H | L |
| | E | L | H | L | H | L | H | L | H |
| SECOND DATA LINE | $D_0$ | H | L | | | OPEN | | | |
| | $D_1$ | L | H | H | L | | | | |
| | $D_2$ | | | L | H | H | L | | |
| | $D_3$ | | | | | L | H | H | L |
| | $D_4$ | OPEN | | | | | | L | H |
| $n^+$ BURIED LAYER | $d_0$ | H | L | | | OPEN | | | |
| | $d_1$ | L | L | H | | | | | |
| | $d_2$ | L | H | H | L | | | | |
| | $d_3$ | | H | L | L | H | | | |
| | $d_4$ | | | L | H | H | L | | |
| | $d_5$ | | | | H | L | L | H | |
| | $d_6$ | | | | | L | H | H | L |
| | $d_7$ | OPEN | | | | | H | L | L |
| | $d_8$ | | | | | | | L | H |

METHOD OF MANUFACTURING A NONVOLATILE MEMORY INCLUDING A MEMORY CELL HAVING A MISFET

BACKGROUND OF THE INVENTION

The present invention relates to a semiconductor integrated circuit device and a technology for manufacturing the same and, more particularly, to a technology which is effective if applied to a semiconductor integrated circuit device having an electrically writable/erasable nonvolatile memory. The nonvolatile memory is disclosed on pp. 311 to 314 of IEDM (International Electron Device Meeting), Technical Digest, 1991, for example.

The semiconductor integrated circuit device having the nonvolatile memory of that kind is constructed to have a memory array, in which are arranged in a matrix shape a plurality of nonvolatile memories composed of MISFETs having a first gate insulating film, a floating gate, a second gate insulating film and a control gate, and to have its memory array divided into a plurality of blocks composed of at least one word line to shorten the access time and improve the reliability.

In each of the blocks of the aforementioned memory array, the nonvolatile memory has its source and drain connected with a first data line formed as a buried layer in a semiconductor substrate, for example, and the first data line is connected through a transfer MISFET (i.e., Metal-Insulator-Semiconductor Field Effect Transistor) with a second data line made of a conductive material such as aluminum (Al). And, the selection of each block of the memory array is carried out by turning ON/OFF the transfer MISFET.

SUMMARY OF THE INVENTION

The present invention has a relation to U.S. Ser. No. 08/031,877 filed before U.S. Patent Office on Mar. 16, 1993.

We have examined the following two methods as a method of manufacturing a nonvolatile memory having the above-specified construction: the (first) method of forming a floating gate of the nonvolatile memory after a buried layer as the first data line has been formed; and the (second) method of forming the buried layer in self-alignment with the floating gate.

According to the aforementioned first method, a silicon nitride film formed over a semiconductor substrate is patterned at first into a stripe shape so as to form a first region, from which is removed the silicon nitride film, and a second region in which is left the silicon nitride film. Subsequently, the silicon nitride film over the second region is used as a mask for implanting the semiconductor substrate of the first region with ions of an impurity having the opposite polarity to that of the substrate, thereby to form the buried layer (or the first data line).

Next, a thick silicon oxide film (or the field insulating film) for element isolations is formed over the aforementioned burled layer, and the silicon nitride film of the second region is removed to form the first insulating film made of a thin silicon oxide film. Subsequently, the floating gate of a polycrystalline silicon film is formed over the first gate insulating film. After this, there is formed over the floating gate the control gate which includes the second gate insulating film (usually composed of three layers—a silicon oxide film/a silicon nitride film/a silicon oxide film) and a polycide film.

According to the second method, on the other hand, over the semiconductor substrate formed with a thick silicon oxide film for element isolations, there is formed the first gate insulating film made of a silicon oxide film. After this, over the first gate insulating film, there are sequentially formed the polycrystalline silicon film for the floating gate and the second gate insulating film (composed of a silicon oxide film/a silicon nitride film/a silicon oxide film).

Next, the aforementioned polycrystalline silicon film and second gate insulating film are patterned in a stripe shape to form a first region, from which are removed those films, and a second region, in which are left those films. Subsequently, the aforementioned second gate insulating film is used as a mask for implanting the semiconductor substrate of the first region with ions of an impurity having an opposite conduction type to that of the substrate to form a buried layer (or the first data line). After this, there is formed over the second gate insulating film the control gate which is formed of a polycide film.

In case the gate of the transfer MISFET is formed in the aforementioned first or second method with a polycrystalline silicon film of the same layer as that of the floating gate or a polycide film of the same layer as that of the control gate, we have found a problem that the reading speed of the nonvolatile memory is regulated by the switching speed of the transfer MISFET.

Specifically, the delay time ($T_W$) for the control gate of the nonvolatile memory to reach the selected level "H" is expressed by the product of the parasitic resistance ($R_W$) and the parasitic capacity ($C_W$) of the word line (as in the expression of $C_W \times R_W = T_W$), and the delay time ($T_{DB}$) for the drain connecting with the first data line to reach the selected level "H" is expressed mainly by the product of the parasitic resistance ($R_T$) and the parasitic capacity ($C_T$) of the transfer MISFET (as in the expression of $C_T \times R_T = T_{DB}$). In case, however, the gate of the transfer MISFET is formed of the same conductive material (e.g., polycrystalline silicon or polycide) as that of the floating gate or control gate of the nonvolatile memory, the delay time of the control gate becomes shorter than that of the drain (i.e., $T_W > T_{DB}$) so that the reading speed of the nonvolatile memory is regulated by the delay time of the transfer MISFET, because the parasitic capacity of the gate of the transfer MISFET becomes larger than the parasitic capacity of the word line (also their parasitic resistances are equal).

We have also found out the following individual problems in the (first and second) methods for manufacturing the aforementioned nonvolatile memory.

First of all, the first method of forming the floating gate of the nonvolatile memory after the buried layer (or the first data line) has been formed is required to have a matching allowance between the photo mask to be used for forming the buried layer by the ion implantation and the photo mask for working the floating gate. As a result, there arises a problem that the miniaturization of the memory size is accordingly obstructed.

On the other hand, the problem mentioned above does not arise in the second method of forming the buried layer in self-alignment with the floating gate. Since, however, this method forms the buried layer (or the first data line) by implanting the semiconductor substrate with impurity ions with the second gate insulating film as the mask, there arises a problem that the second gate insulating film is deteriorated by the damage coming from the ion implantation.

In order to solve this problem, however, it is conceivable to leave the mask, which has been used for patterning the polycrystalline silicon film for the floating gate and the overlying second gate insulating film, over the second insulating film and to perform the ion implantation by using the photo mask. If, however, the polycrystalline silicon film for the floating gate and the second gate insulating film are patterned, the surrounding first gate insulating film over the semiconductor substrate is etched more or less to have its thickness reduced so that its quality is degraded by the impurity coming from the resist film. If, therefore, the ion implantation is carried our for forming the buried layer while leaving the first gate insulating film, the semiconductor substrate is contaminated. The influences of this contamination are serious especially in the memory cell such as the flash memory, in which the data are written or erased between the floating gate and the substrate by the electron tunneling through the first insulating film, because the first insulating film is made as thin as 100 angstroms or less. The contamination described above will deteriorate the element characteristics.

In order to prevent this contamination, therefore, it is necessary to remove the photo mask from the second gate insulating film, after the polycrystalline silicon film for the floating gate and the second gate insulating film over the former have been patterned, and to form a new first gate insulating film over the semiconductor substrate. In other words, the ion implantation for forming the buried layer cannot be accomplished while leaving on the second gate insulating film the photo mask which has been used for patterning the polycrystalline silicon film for the floating gate and the overlying second gate insulating film.

The present invention has been conceived in view of the above-specified problems of the prior art and has an object to provide a technology capable of shortening the reading time of a nonvolatile memory.

Another object of the present invention is to provide a technology capable of promoting the miniaturization of the nonvolatile memory.

A further object of the present invention is to provide a technology capable of improving the reliability of the nonvolatile memory.

The aforementioned and other objects and novel features of the present invention will become apparent from the following description to be made with reference to the accompanying drawings.

Representatives of the invention to be disclosed herein will be summarized in the following.

(1) A semiconductor integrated circuit device comprising a memory array, in which are arranged in a matrix shape a plurality of electrically writable/erasable nonvolatile memory cells including MISFETs and having a first gate insulating film, a floating gate, a second gate insulating film and a control gate, in which said memory array is divided into a plurality of blocks having at least one word line connected with the control gates of said nonvolatile memory cells, in which the nonvolatile memory cell in each block has its source and drain connected with a first data line divided and formed for each block, in which said first data line is connected with a second data line through a transfer MISFET for selecting said blocks, and in which said transfer MISFET has its gate made of the same conductive material as that of the control gate or floating gate of said nonvolatile memory cell, wherein the improvement resides in that said transfer MISFET has its gate shunted by a wiring line which is made of a conductive material having a lower resistance than that of a conductive material making the control gate or floating gate of said nonvolatile memory cell.

(2) A method of manufacturing an electrically writable/erasable nonvolatile memory including MISFETs and having a first gate insulating film, a floating gate electrode, a second gate insulating film and a control gate electrode, comprising the steps of: forming over a semiconductor substrate sequentially the first gate insulating film, a first conductor layer for the floating gate electrode, an insulating film having at least its uppermost layer of a silicon nitride film for the second gate insulating film, and a silicon oxide film; patterning said silicon oxide film, said insulating film and said first conductor layer in a stripe shape extending in a first direction; and forming a semiconductor region extending in said first direction by using the stripe-patterned silicon oxide film as a mask to implant the intervening semiconductor substrate with the ions of a first impurity.

According to the above-specified means (1), the gate of the transfer MISFET, which is made of the same conductive material as that of the control gate or floating gate of the nonvolatile memory cell, is shunted through the wiring line which is made of a conductive material having a lower resistance than that of the former conductive material. As a result, the gate of the transfer MISFET can be given a lower parasitic resistance than that of the control gate (or word line) of the nonvolatile memory cell so that the reading time of the nonvolatile memory cell can be shortened.

According to the above-specified second means (2), the semiconductor region is formed in self-alignment with the first conductor layer forming the floating gate of the nonvolatile memory cell so that the memory cell size can be more miniaturized than the prior art which requires a matching allowance between the photo mask used for forming the semiconductor region and the photo mask for forming the floating gate.

According to the above-specified second means (2), when the semiconductor region is to be formed by the ion Implantation, the silicon oxide film is formed over the silicon nitride film forming part of the second gate insulating film so that the silicon nitride film earl be prevented from being damaged by the ion implantation.

Here will be described the nonvolatile memory and the method of manufacturing the same according to the present invention in connection with their embodiments.

Incidentally, the portions having the same functions are designated at the same reference characters throughout the Figures for explaining the embodiments, and their repeated description will be omitted.

BRIEF DESCRIPTION OF THE DRAWINGS

FIG. 2 is a diagram for explaining the data writing operation of the nonvolatile memory of the present invention;

FIG. 3 is a diagram for explaining the data reading operation of the nonvolatile memory of the present invention;

FIG. 9 is a diagram for explaining the write and read operations of the nonvolatile memory shown in FIG. 8;

DESCRIPTION OF THE PREFERRED EMBODIMENTS

With reference to FIGS. 1 to 6, here will be described the construction of a semiconductor integrated circuit device having a flash memory according to one embodiment of the present invention. As to this flash memory, one example of a memory cell is disclosed on pp. 303 to 306 of IEDM, Technical Digest, 1991.

Figure 4:
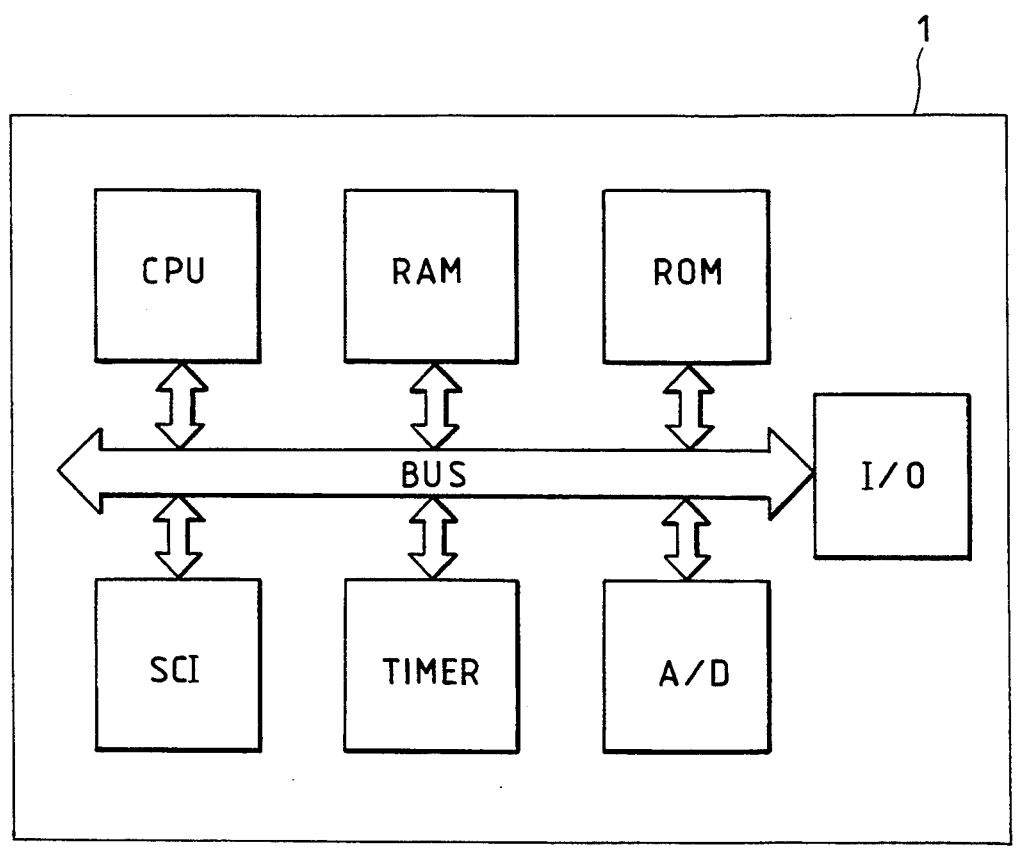
FIG. 4 is a block diagram showing a microcomputer packaged with the nonvolatile memory of the present invention.

As shown in FIG. 4, the flash memory of the present embodiment is packaged in a microcomputer which is formed over a semiconductor substrate (or chip) 1. This microcomputer is constructed to include a CPU, a RAM, a ROM, a serial communication interface (SCI), a timer (TIMER), an analog/digital converter (A/D) and an input/output unit (I/O).

The CPU is an arithmetic unit containing various registers and control circuits for arithmetic operations. The ROM including the flash memory of the present embodiment is used to store programs and dictionary data. The RAM is used to latch the data being operated temporarily. These CPU, ROM, RAM, SCI, TIMER, A/D and I/0 are mutually connected through a BUS. This BUS is constructed to include a data bus, an address bus and a control bus.

Figure 5:
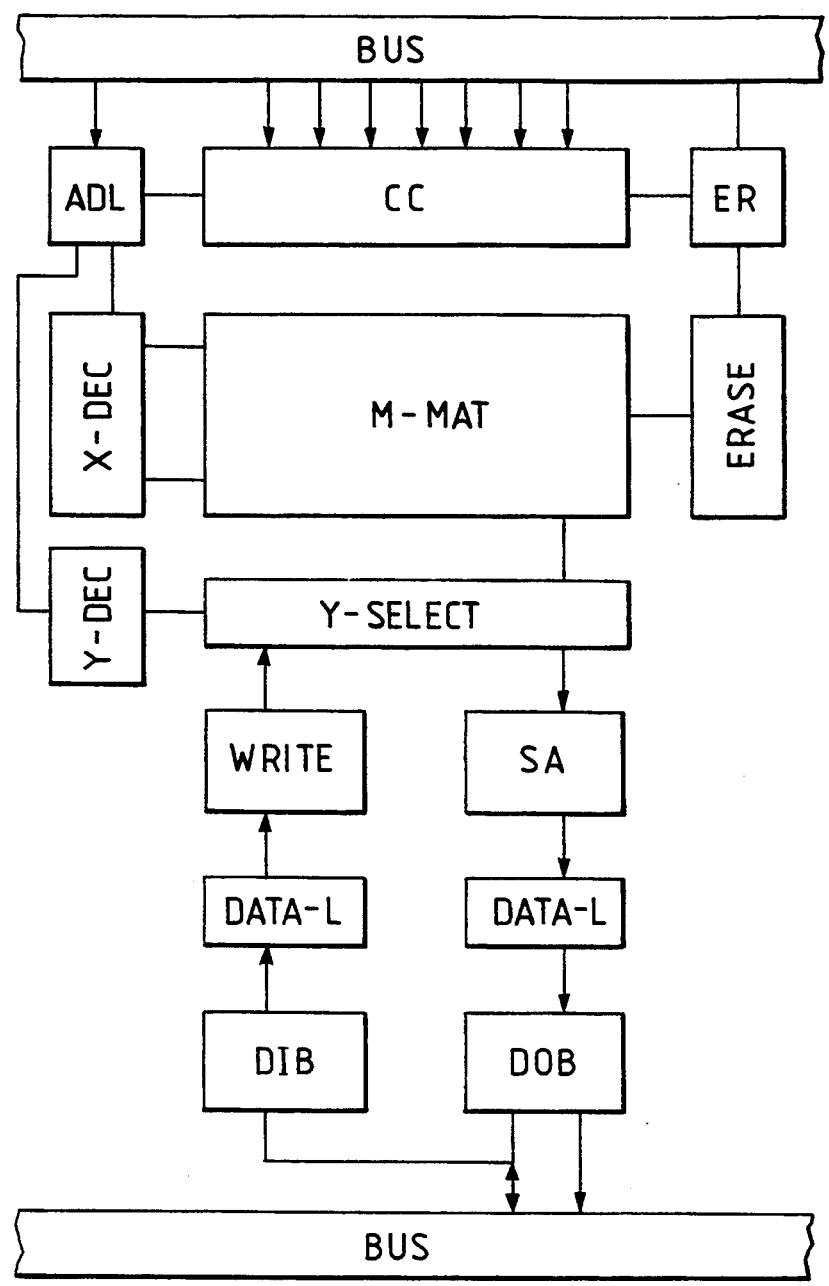
FIG. 5 is a diagram showing the circuit construction of a ROM having the nonvolatile memory of the present invention.

As shown in FIG. 5, the ROM is controlled as a whole through a control circuit (CC) by signals coming from the BUS. The address data coming from the BUS are once latched in an address latch (ADL), and an X-decoder (X-DEC) and a Y-decoder (Y-DEC) are controlled by the control circuit (CC) so that a desired memory cell of a memory mat (M-MAT) is selected. As will be described hereinafter, the memory mat (M-MAT) is divided into a plurality of blocks.

For reading out the data, the data line output selected by a Y-select (Y-SELECT) is sensed by a sense amplifier (SA) and is once latched in a data latch (DATA-L) until it is outputted under the control of the control circuit (CC) to the BUS through an output buffer (DOB).

For writing in the data, the write data inputted through an input buffer (DIB) from the BUS are once latched in the data latch (DATA-L) and are then written through a write circuit (WRITE) under the control of the control circuit (CC).

The erasure of the data is carried out at the unit of a block. Specifically, the block to be erased is designated by an erasure block designate register (ER) so that the data in the designated block are erased as a whole through an erase circuit (ERASE).

Figure 6A:
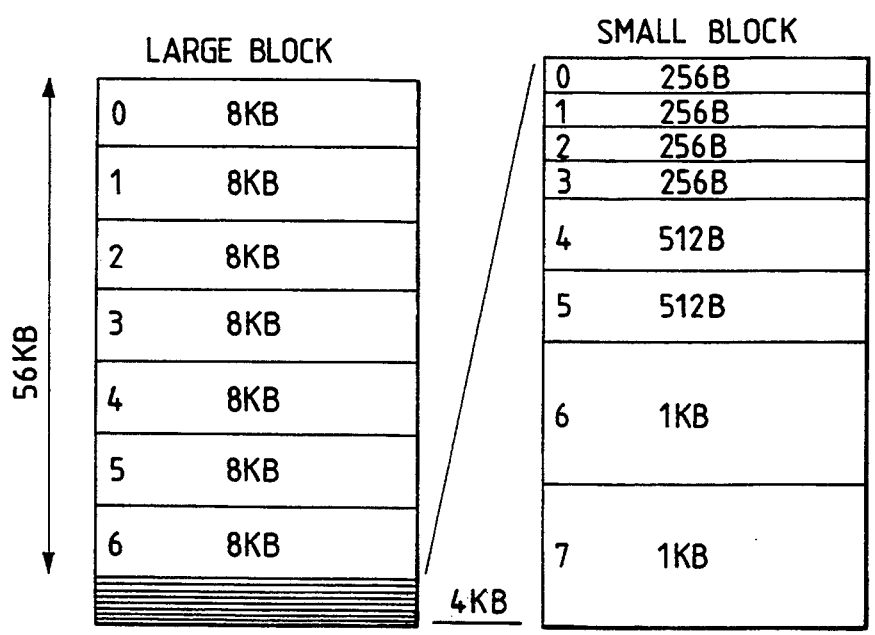
FIG. 6(a) is a diagram showing a block construction of a memory mat.

As shown in FIG. 6(a), the aforementioned memory mat (M-MAT) is divided into seven large blocks and one small block, by way of example. The large blocks (0 to 6) are so evenly divided to have a capacity of 8 KB individually, and the small block is further unevenly divided into eight blocks (0 to 7) having capacities of 256 B, 512 B or 1 KB.

Figure 6B:
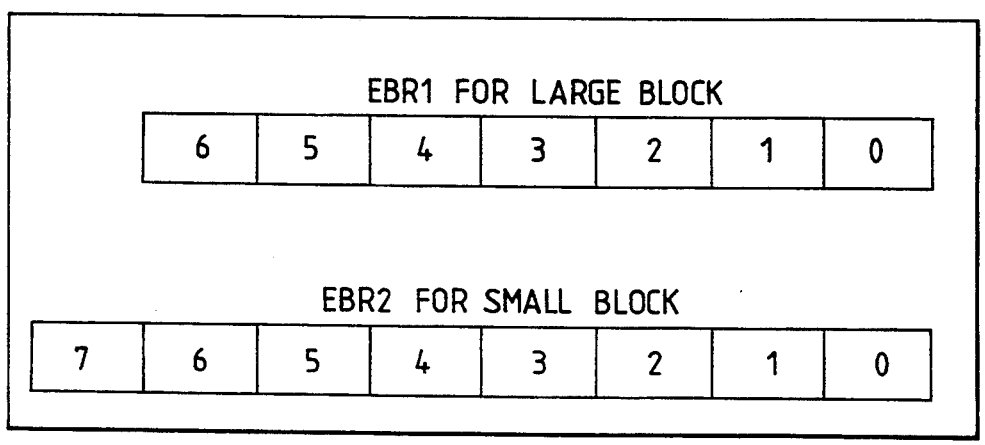
FIG. 6(b) is a diagram showing a construction of an erase block designating register corresponding to the block construction.

As shown in FIG. 6(b), moreover, the aforementioned erase block designate register (ER) is constructed to include fifteen registers (i.e., seven large block designating registers (EBR1) and eight small block designating registers (EBR2)) corresponding to the aforementioned fifteen blocks. For example, the block having the "1" bit corresponding to the erase block designate register is the block to be erased.

Figure 1:
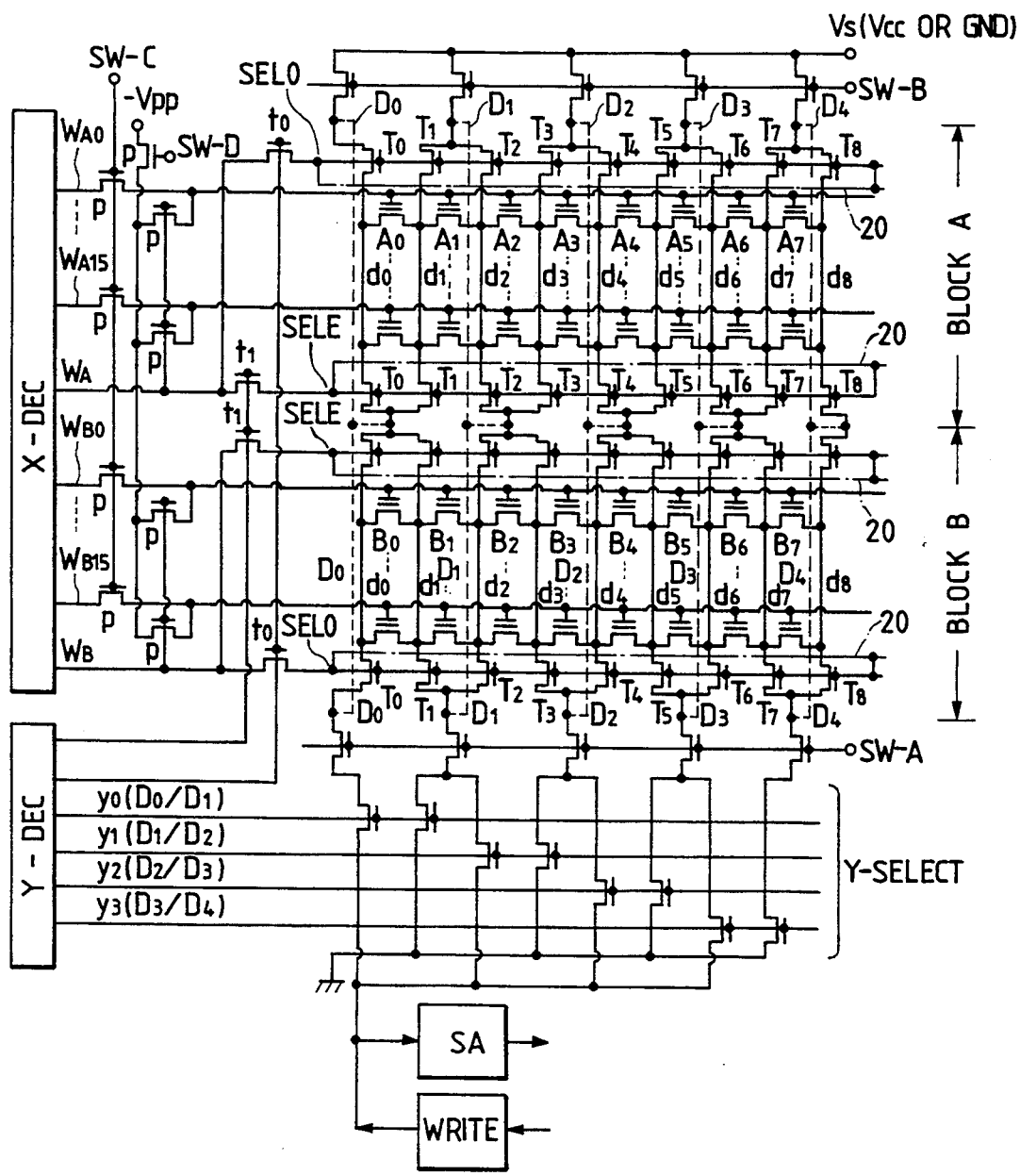
FIG. 1 is a diagram showing a circuit construction of a nonvolatile memory according to one embodiment of the present invention.

Next, the circuit construction of the aforementioned memory mat (M-MAT) will be described in more detail with reference to FIG. 1. Incidentally, FIG. 1 shows only the individual portions of the two (i.e., the block A and the block B) of the fifteen blocks shown in FIG. 6(a).

Memory cells $A_0$ to $A_7$ of the block A and memory cells $B_0$ to $B_7$ of the block B are constructed to include n-channel MISFETs having a control gate, a floating gate, a source and a drain.

The aforementioned MISFET has its control gate made of polycide and its floating gate made of polycrystalline silicon. The source and drain of the MISFET are connected with n+-buried layers $d_0$ to $d_8$ which are formed as a first data line in the semiconductor substrate 1.

The n+-buried layers $d_0$ to $d_8$ are divided for each block of the memory mat (M-MAT) and are connected with second data lines $D_0$ to $D_4$ through transfer MISFETs $T_0$ to $T_8$. In a direction to intersect the n+-buried layer $d_0$ to $d_8$, on the other hand, there are extended word lines $W_{A0}$ to $W_{A15}$ and $W_{B0}$ to $W_{B15}$ which act as the control gates of the memory cells $A_0$ to $A_7$ and $B_0$ to $B_7$. These word lines $W_{A0}$ to $W_{A15}$ and $W_{B0}$ to $W_{B15}$ are connected with the X-decoder (X-DEC) through a switch (SW-C).

The aforementioned second data lines $D_0$ to $D_4$ are made of Al wiring lines formed over the word lines $W_{A0}$ to $W_{A15}$ and $W_{B0}$ to $W_{B15}$ and are extended to intersect the word lines $W_{A0}$ to $W_{A15}$ and $W_{B0}$ to $W_{B15}$. On the other hand, each of the second data lines $D_0$ to $D_4$ is provided for the two n+-burled layer $d_0$ to $d_8$ acting as the first data line and has its one end connected through the switch (SW-A) with the Y-select (Y-SELECT) and its other end connected through a switch (SW-B) with a potential $[V_s]$. This potential $[V_s]$ is exemplified by a supply potential $[V_{cc}]$ of the circuit or a reference potential (GND).

The aforementioned transfer MISFETs $T_0$ to $T_8$ are disposed in each block at the two end portions of the n+-buried layers $d_0$ to $d_8$. Moreover, the transfer MISFETs $T_0$ to $T_8$ have their gates (SEL0 and SELE) connected through switches $t_0$ and $t_1$ with the block select word lines $W_A$ and $W_B$, which are connected with the X-decoder (X-DEC).

In the present embodiment, the transfer MISFETs $T_0$ to $T_8$ have their gates (SEL0 and SELE) made of the same layer of polycrystalline silicon as that of the floating gates of the memory cells $A_0$ to $A_7$ and $B_0$ to $B_7$ and are shunted at every 8 bits by an Al wiring line 20 having a lower resistance than the polycrystalline silicon so as to have their parasitic resistance reduced. The Al wiring line 20 is formed in a higher wiring layer than the Al wiring line forming the aforementioned second data lines $D_0$ to $D_4$ and is extended in parallel with the gates (SEL0 and SELE) of the transfer MISFETs $T_0$ to $T_8$.

Next, the circuit operations of the aforementioned memory mat (M-MAT) will be described with reference to FIGS. 1 to 3.

For writing the data, first of all, the switch (SW-A) is turned ON, and the switch (SW-B) is turned OFF so that the potentials of the second data lines $D_0$ to $D_4$ may be controlled through the Y-select (Y-SELECT) by the Y-decoder (Y-DEC). Moreover, the switch (SW-C) is turned ON, and the switch (SW-D) is turned OFF so that the potentials of the word lines $W_{A0}$ to $W_{A15}$ and $W_{B0}$ to $W_{B15}$ may be controlled by the X-decoder (X-DEC).

The selection of the blocks is carried out by the block select word lines $W_A$ and $W_B$, and the selection of the n+-burled layers $d_0$ to $d_8$ in each block is carried out by the second data lines $D_0$ to $D_4$ and the switches $t_0$ and $t_1$.

The selection of the memory cells $A_0$, $A_2$, $A_4$ and $A_6$ of the block A is carried out by turning ON the switch $t_0$ and the transfer transfer MISFETs $T_0$ to $T_8$ connected with the gate (SEL0). On the other hand, the selection of the memory cells $A_1$, $A_3$, $A_5$ and $A_7$ is carried out by turning ON the switch $t_1$ and the transfer MISFETs $T_0$ to $T_8$ connected with the gate (SELE). (The selection of the memory cells $B_0$ to $B_7$ of the block B is likewise carried out.)

The selection of the second data lines $D_0$ to $D_4$ is carried out through the Y-select (Y-SELECT) by the Y-decoder (Y-DEC). If one (e.g., $D_1$) of the second data lines $D_0$ to $D_4$ is selected, its righthand second data line ($D_2$) takes the GND level whereas all the remaining second data lines take the floating state (OPEN).

If the data are to be written in the memory cell $A_2$, for example: the second data line $D_1$ takes the selected level "H", and the second data line $D_2$ takes the GND level (i.e., the unselected level "L"), whereas the remaining second data lines take the floating state. If, on the other hand, the transfer MISFETs $T_0$ to $T_8$ connected with the gate (SEL0) are turned ON, the n+-buried layers $d_1$ and $d_2$ take the selected level "H", and the n+-buried layer $d_3$ and $d_4$ take the GND level, whereas the remaining n+-buried layer take the floating state.

As a result, the n+-buried layer $d_2$ connected with the drain of the memory cell $A_2$ takes the selected level "H", and the n+-buried layer $d_3$ connected with the source of the same takes the GND level so that the memory cell $A_2$ is selected. At this time, the memory cell $A_0$ is not written because both the n+-buried layer $d_1$ and $d_2$ take the selected level "H" so that the source and the drain take the same potential. On the other hand, the memory cell $A_1$ is not written either although the n+-buried layer $d_1$ connected with the source takes the selected level "H", because the n+-buried layer $d_0$ connected with the drain takes the floating state.

In case the data are to be written in the memory cell $A_3$, on the other hand, the second data line $D_1$ takes the selected level "H", and the second data line $D_2$ takes the GND level, whereas the remaining second data lines take the floating state. Moreover, by turning ON the transfer MISFETs $T_0$ to $T_8$ connected with the gate (SELE), the n+-buried layers $d_2$ and $d_3$ take the selected level "H", and the n+-buried layers $d_4$ and $d_5$ take the GND level, whereas the remaining n+-buried layers take the floating state.

As a result, the n+-buried layer $d_3$ connected with the drain of the memory cell $A_3$ takes the selected level "H", and the n+-buried layer $d_4$ connected with the source takes the GND level, so that the memory cell $A_3$ is selected. Incidentally, the write voltage $[V_{pp}]$ to be applied to the control gate (or word line) of the selected memory cell is exemplified by 12 V, and the voltage to be applied to the drain (or the n+-buried layer) is exemplified by 6 V.

Next, in the data reading case, the selection of the memory cell is carried out as in the aforementioned writing operation. In the present embodiment, as described above, the transfer MISFETs $T_0$ to $T_8$ made of polycrystalline silicon have their gates shunted by the Al wiring line 20. (Incidentally, the sheet resistance of Al is about one hundred as low as that of the polycide, i.e., a wiring material having a lower resistance than the polycrystalline silicon.)

As a result, the parasitic resistance of the gates of the transfer MISFETs $T_0$ to $T_8$ becomes lower than that of the control gates (i.e., the word lines $W_{A0}$ to $W_{A15}$, and $W_{B0}$ to $W_{B15}$) of the memory cells $A_0$ to $A_7$ and $B_0$ to $B_7$ so that the delay time ($T_{DB}$) for the drains of the selected memory cells $A_0$ to $A_7$ and $B_0$ to $B_7$ to reach the selected level "H" is shorter than the delay time ($T_w$) of the word lines $W_{A0}$ to $W_{A15}$ and $W_{B0}$ to $W_{B15}$. As a result, the reading time of the memory cells $A_0$ to $A_7$ and $B_0$ to $B_7$ can be made far shorter than that of the prior art.

On the other hand, the data erasure is different in operations depending upon its methods. This erasure methods include the gate negative-bias method, the substrate positive-bias method and the source/bias method, as shown in FIG. 3.

First of all, in the gate negative-bias method, the selection of the block to be erased is carried out by the block select word lines $W_A$ and $W_B$ through a p-channel MISFET (p). The $n^+$-buried layers $d_0$ to $d_8$ in the selected block are fed through the transfer MISFETs $T_0$ to $T_8$ with the [$V_s$] potential (e.g., [$V_{cc}$] or GND).

Then, the switch (SW-A) and the switch (SW-C) are turned OFF to separate the selected block from the Y-Decoder (Y-DEC) and the X-decoder (X-DEC) (while the switch (SW-B) being ON), and the switch (SW-D) is turned ON to apply an erasing high negative potential [$-V_{pp}$] to the word lines in the block.

The erasing operation of the substrate positive-bias method is substantially similar to that of the aforementioned gate negative-bias method. While the $n^+$-buried layers $d_0$ to $d_8$ in the selected block are being fed with the erasing high potential [$V_{pp}$], the high potential [$V_{pp}$] (or [$V_{cc}$]) is applied to the substrate. On the other hand, the source/bias method is carried out by changing the [$V_s$] potential into the high potential [$V_{pp}$] to apply the high potential [$V_{pp}$] to the $n^+$-buried layer $d_0$ to $d_8$ in the selected block.

Figure 7:
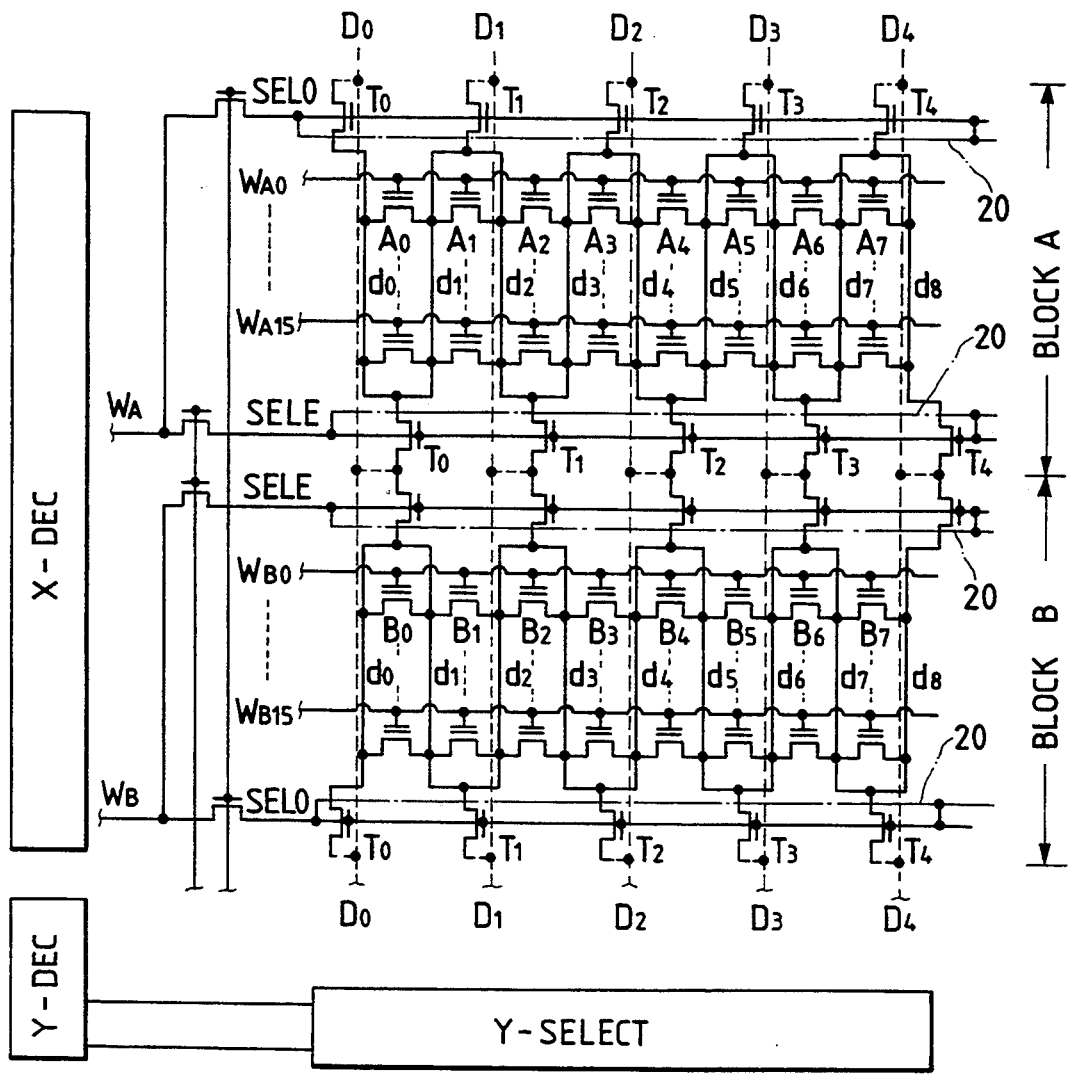
FIG. 7 is a diagram showing a circuit construction of a nonvolatile memory according to another embodiment of the present invention.

FIG. 7 shows another circuit construction of the flash memory of the present embodiment, in which one of the transfer MISFETs $T_0$ to $T_4$ is provided for two of the memory cells $A_0$ to $A_7$ and $B_0$ to $B_7$. Moreover, the transfer MISFETs $T_0$ to $T_4$ have their gates shunted through the Al wiring line 20.

In the flash memory having the circuit construction described above, too, the delay time ($T_{DB}$) for the drains of the selected memory cells $A_0$ to $A_7$ and $B_0$ to $B_7$ to reach the selected level "H" is shorter than the delay time ($T_w$) of the word lines $W_{A0}$ to $W_{A15}$ and $W_{B0}$ to $W_{B15}$ so that the reading time of the memory cells $A_0$ to $A_7$ and $B_0$ to $B_7$ can be made far shorter than that of the prior art.

Figure 8:
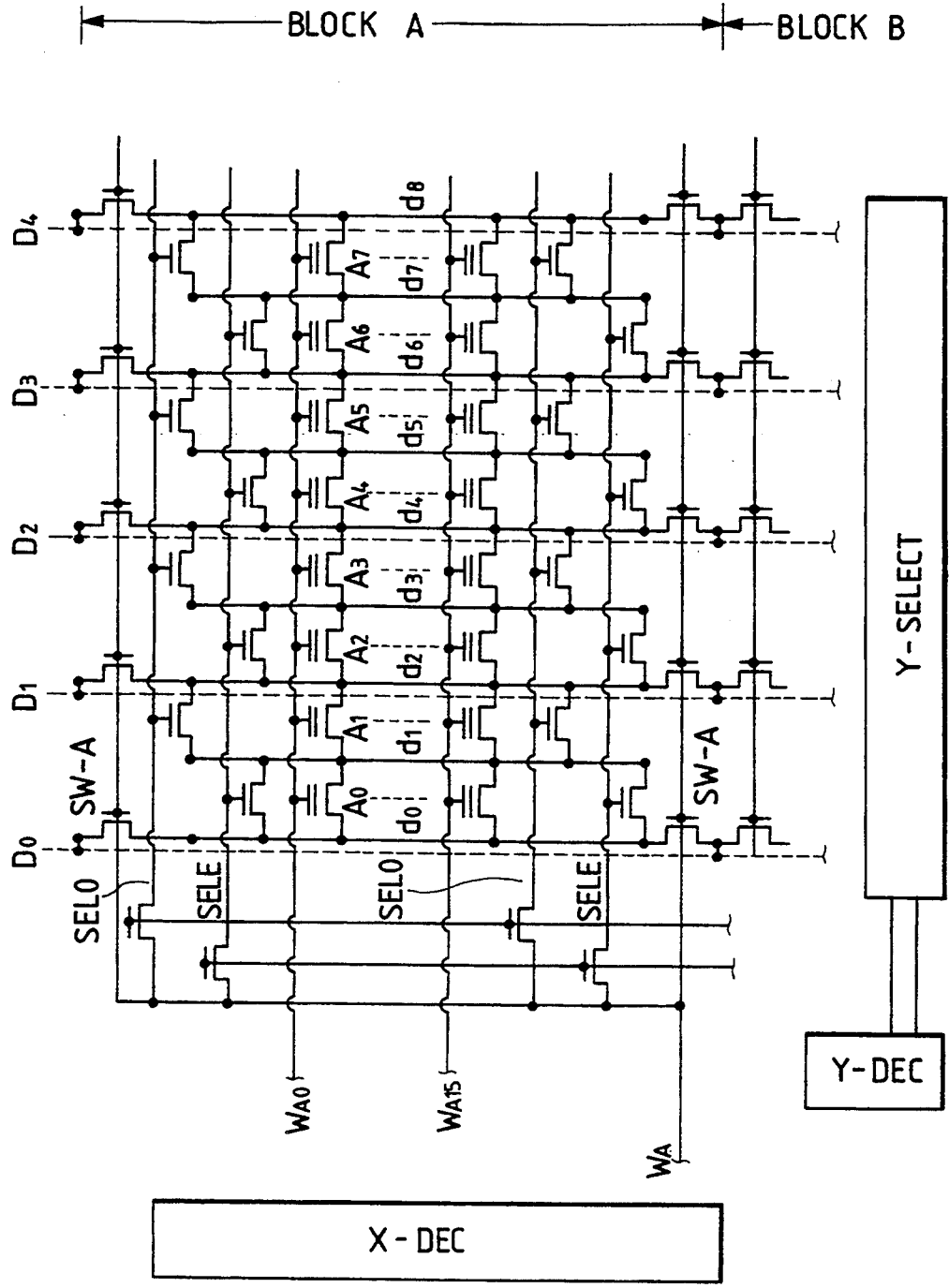
FIG. 8 is a diagram showing a circuit construction of a nonvolatile memory according to still another embodiment of the present invention.
Figure 10:
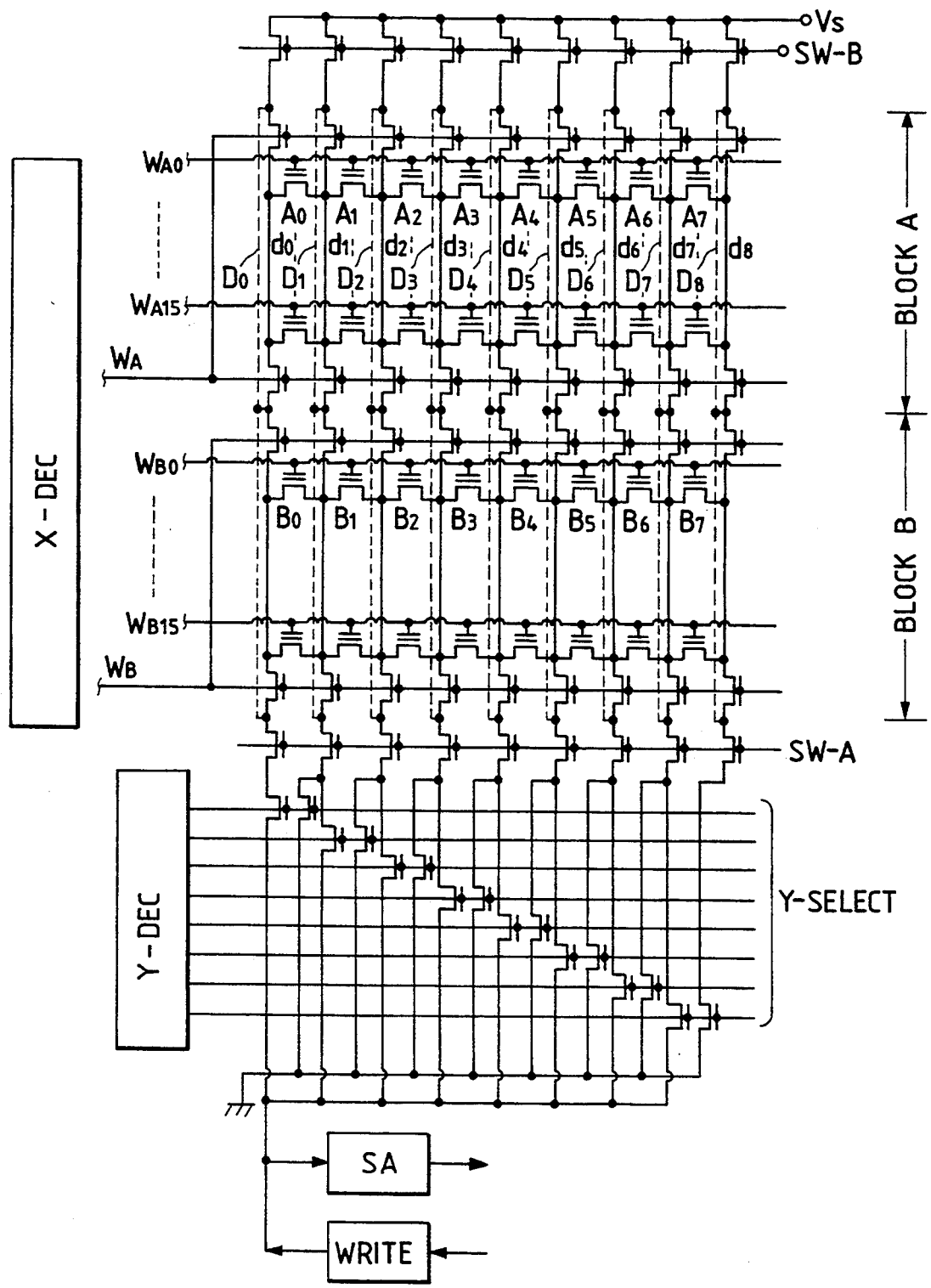
FIG. 10 is a diagram showing a circuit construction of a nonvolatile memory according to a further embodiment of the present invention.

FIGS. 8 and 10 show other circuit constructions of the flash memory of the present embodiment. FIG. 8 shows an embodiment, in which the switch (SW-A) is disposed in the $n^+$-buried layers $d_0$ to $d_8$ between the adjoining blocks, and its writing/reading operations are shown in FIG. 9. Incidentally, the selection of the blocks is carried out by the WA (i.e., SW-A). On the other hand, FIG. 10 shows an embodiment, in which one of the second data lines $D_0$ to $D_4$ is provided for each of the $n^+$-buried layers $d_0$ to $d_8$ acting as the first data line.

In the flash memory having such circuit constructions, too, the reading time of the memory cells $A_0$ to $A_7$ and $B_0$ to $B_7$ can be drastically shortened more than the prior art by shunting the gates of the transfer MISFETs through the Al wiring line, although not shown.

Here will be described a method of manufacturing the flash memory (for erasing the data by the gate negative-bias method) of the present embodiment with reference to FIGS. 11 to 22. Incidentally, the following description is directed mainly to the method of manufacturing n-channel MISFETs constructing the memory cell and the transfer MISFETs for selecting the blocks. Moreover, the peripheral circuits are constructed to include complementary MISFETs.

Figure 11:
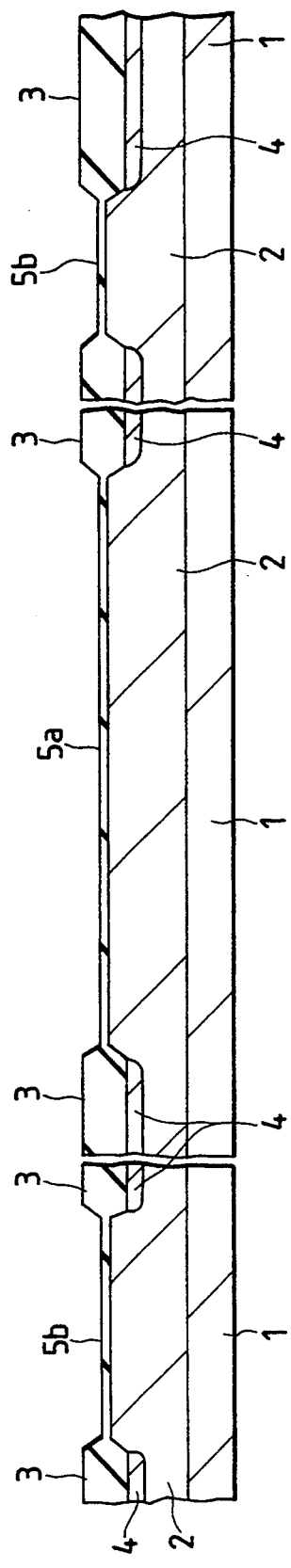
FIG. 11 is a section of an essential portion of a semiconductor substrate and shows a method of manufacturing a nonvolatile memory according to one embodiment of the present invention.

First of all, as shown in FIG. 11, an $p^-$-type semiconductor substrate 1 made of a single crystal of silicon is formed by an ion implantation with a p-type well (i.e., p-well) 2. After this, the p-well 2 is formed on its principal face with an element separating thick field insulating film 3 made of silicon oxide. At this time, moreover, a $p^-$-type channel stopper region 4 is formed below the field insulating film 3.

Subsequently, the semiconductor substrate 1 has its principal face formed at a memory cell forming region (as located at the central portion of FIG. 11) with a first gate insulating film 5a having a thickness of about 8 to 12 nm and at a transfer MISFET forming region (as located at the righthand side of FIG. 11) and at a peripheral circuit forming region (as located at the lefthand side of FIG. 11) with a gate insulating film 5b having a thickness of about 40 to 50 nm. These first gate insulating film 5a and gate insulating film 5b are made of a silicon oxide film by a thermal oxidation. Incidentally, as the peripheral circuit forming region, only the MISFET forming region is shown, but the p-channel MISFET forming region is omitted.

Figure 12:
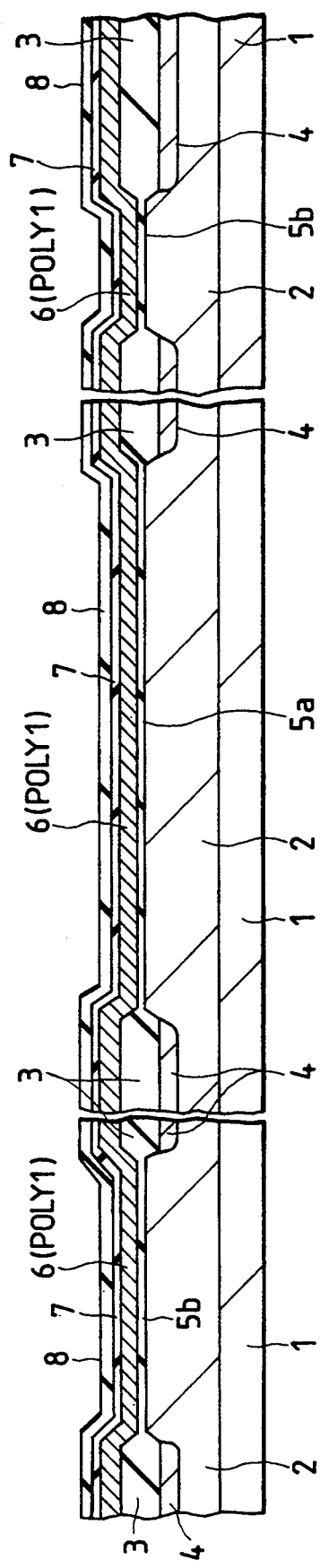
FIG. 12 is a section of the essential portion of the semiconductor substrate and shows the nonvolatile memory manufacturing method according to the embodiment of the present invention.

Next, as shown in FIG. 12, the semiconductor substrate 1 is formed over its principal face with a first conductor layer 6 for constructing a floating gate 6a of the memory cell and the gate of the transfer MISFET. After this, the first conductor layer 6 is overlain by a second gate insulating film 7 composed of two layers of silicon oxide and silicon nitride. This second gate insulating film 7 is overlain by a silicon oxide film 8 acting as a damage preventing film.

The first conductor layer 6 is made of a film of n-type polycrystalline silicon having a thickness of about 200 to 300 nm and deposited by the CVD (Chemical Vapor Deposition) method. The coping of the polycrystalline silicon film with the n-type impurity is carried out either by the thermal diffusion after the deposition of the polycrystalline silicon film or during the deposition of the polycrystalline silicon film.

The aforementioned second gate insulating film 7 is formed by thermally oxidizing the aforementioned polycrystalline silicon film to form a silicon oxide film having a thickness of about 20 nm thereover and subsequently by depositing a silicon nitride film having a thickness of about 20 nm on the silicon oxide layer by the CVD method. Moreover, the aforementioned silicon oxide film 8 is deposited to have a thickness of about 50 to 100 nm by the CVD method.

Figure 13:
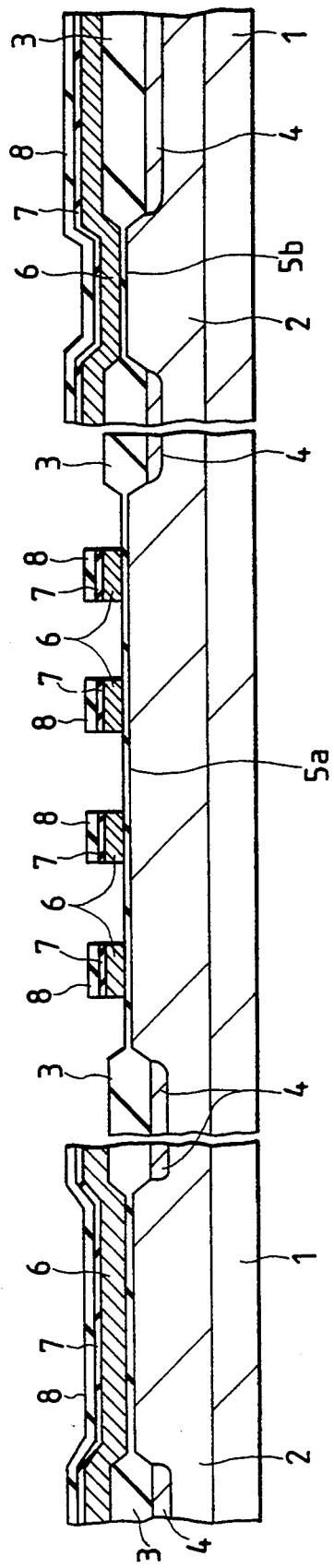
FIG. 13 is a section of the essential portion of the semiconductor substrate and shows the nonvolatile memory manufacturing method according to the embodiment of the present invention.

Next, as shown in FIG. 13, the aforementioned silicon oxide film 8, second gate insulating film 7 and first conductor layer 6 are patterned into a stripe shape to form a region, from which those films are removed, and a second region in which those films are left. Incidentally, the first conductor layer is left in the peripheral circuit forming region.

Figure 14:
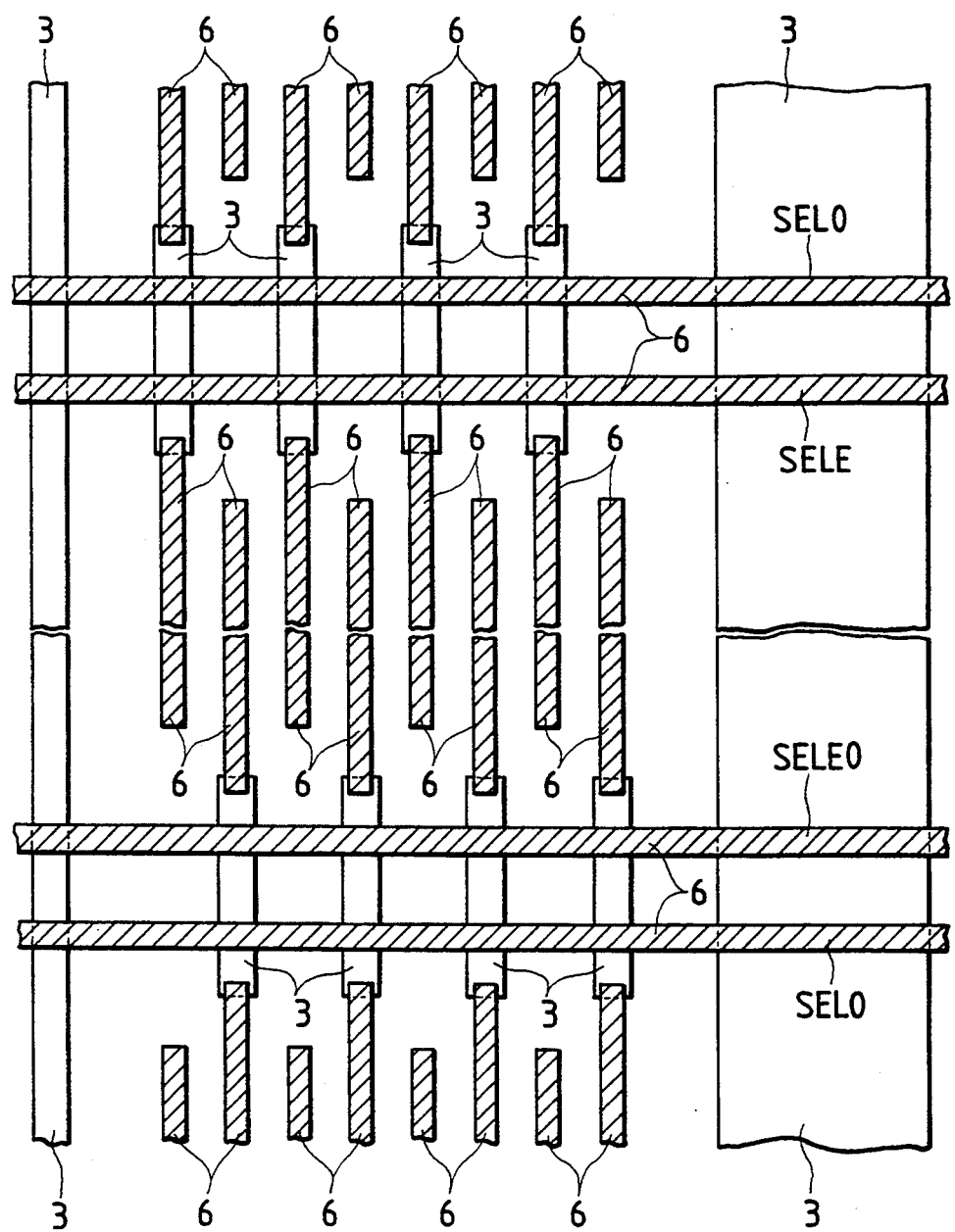
FIG. 14 is a top plan view showing an essential portion of a memory mat and shows a method of manufacturing a nonvolatile memory according to the embodiment of the present invention.

FIG. 14 is a top plan view showing the semiconductor substrate i corresponding to the aforementioned manufacture step of FIG. 13. Incidentally, the peripheral circuit forming region is omitted. The first conductor layer 6 constructing the floating gate of the memory cell is extended in the stripe shape along the longitudinal direction of FIG. 14, and the first conductor layer 6 constructing the gate (i.e., the word lines SELO and SELE) of the transfer MISFET is extended in the stripe shape along the transverse direction of FIG. 14 (although the second gate insulating film 7 and the silicon oxide film 8 over the first conductor layer 6 are omitted from FIG. 14).

As shown in FIG. 14, the first conductor layer 6 constructing the floating gate of the memory cell is separated for every eight (or 8 bits) by the field insulating film 3 (although only four of the eight first conductive layers 6 are shown in FIG. 13). Moreover, the first conductor layers 6 are so arranged that they are alternatively superposed on the portions of the field insulating films 3 at the end portions of each block.

Figure 16:
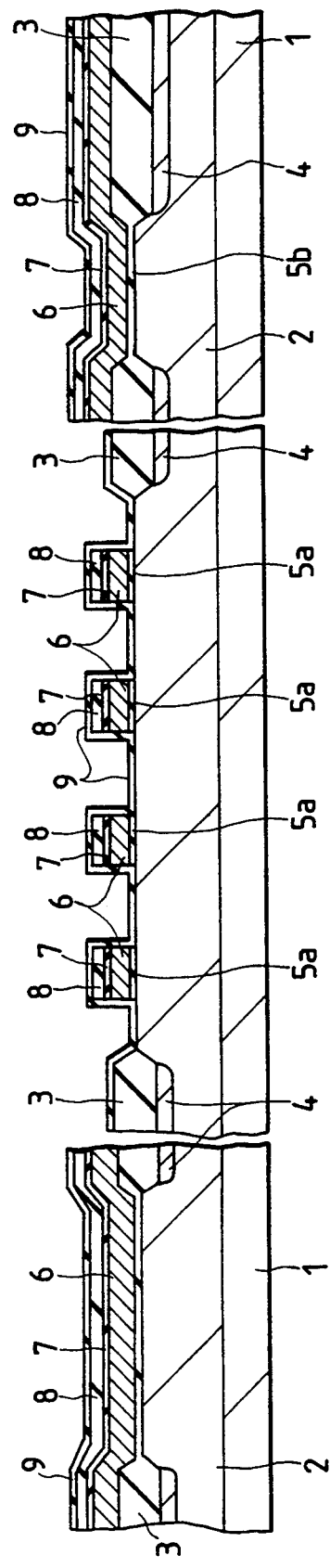
FIG. 16 is a section of the essential portion of the semiconductor substrate and shows the nonvolatile memory manufacturing method according to the embodiment of the present invention.

Next, as shown in FIG. 16, the first gate insulating film 5a and the gate insulating film 5b of the first region are etched off, and a silicon oxide film 9 having a thickness of about 20 nm is then deposited all over the semiconductor substrate 1 by the CVD method.

Figure 17A:
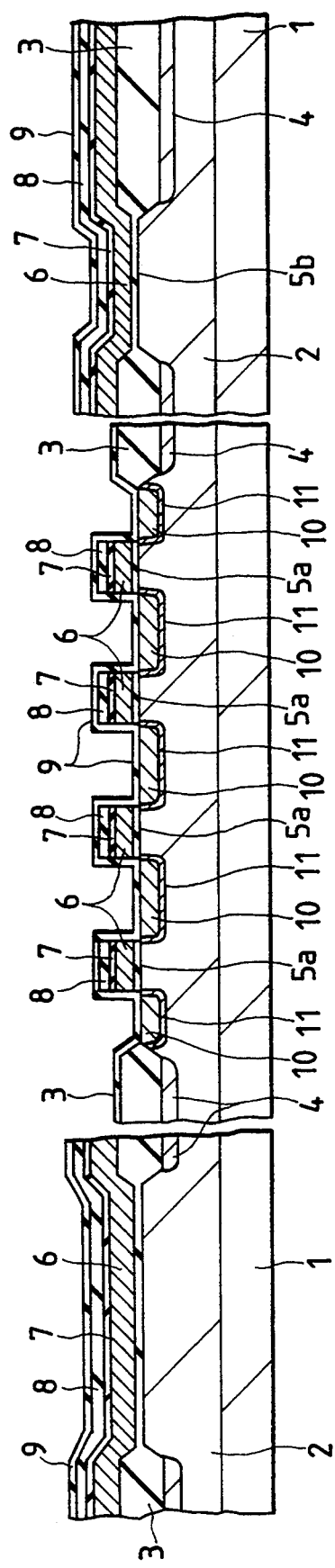
FIGS. 17a and 17b are sections of the essential portion of the semiconductor substrate and show the nonvolatile memory manufacturing method according to the embodiment of the present invention.

Next, as shown in FIG. 17a, the aforementioned silicon oxide film 9 is used as a mask for implanting the memory cell forming region with the ions of an impurity, and this impurity is extended and diffused at by the heat treatment of about 950° C. to form an n+-buried layer 10 and a p-type semiconductor region 11 for forming the source, drain and first data line of the memory cell.

The aforementioned n+-buried layer 10 is formed by introducing an n-type impurity or arsenic (As) in a dosage of about 1 to $5 \times 10^{15}$/cm$^2$ or additionally phosphorous (P) in a dosage of about $1 \times 10^{15}$/cm$^2$. Moreover, the p-type semiconductor region 11 underlying the n+-buried layer 10 is formed by introducing a p-type impurity or boron in a dosage of about $1 \times 10^{14}$/cm$^2$.

Figure 17B:
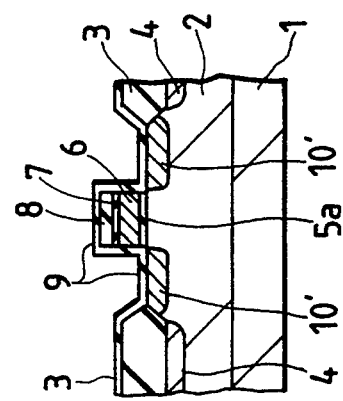

As shown in FIG. 17b, moreover, the aforementioned silicon oxide film 9 is used as a mask to implant the transfer MISFET forming region with the ions of phosphorous in a dosage of about 1 to 5 $10^{15}$/cm$^2$ thereby to form an n-type semiconductor region 10' for constructing the source and drain of the transfer MISFET. This n-type semiconductor region 10' is formed integrally with the n+-buried layer 10. Incidentally, FIG. 17a presents a section taken along the channel width direction of the transfer MISFET, and FIG. 17b presents a section taken along the channel length direction.

Thus, the method of manufacturing the flash memory according to the present embodiment forms the n+-buried layer 10 in self-alignment with the first conductor layer 6 constructing the floating gate of the memory cell shown in FIG. 14. As a result, the memory cell size can be miniaturized more than the prior art which requires the matching allowance between the photo mask used for forming the n+-buried layer and the photo mask for forming the floating gate.

In the method of manufacturing the flash memory of the present embodiment, moreover, when the n+-buried layer 10 is to be formed by the ion implantation, the silicon oxide film 8 is formed as a passivation film (or the damage preventing film) over the first conductor layer 6 and on the second insulating film 7 so that the second gate insulating film can be effectively prevented from being deteriorated by the damage of the ion implantation.

Figure 18:
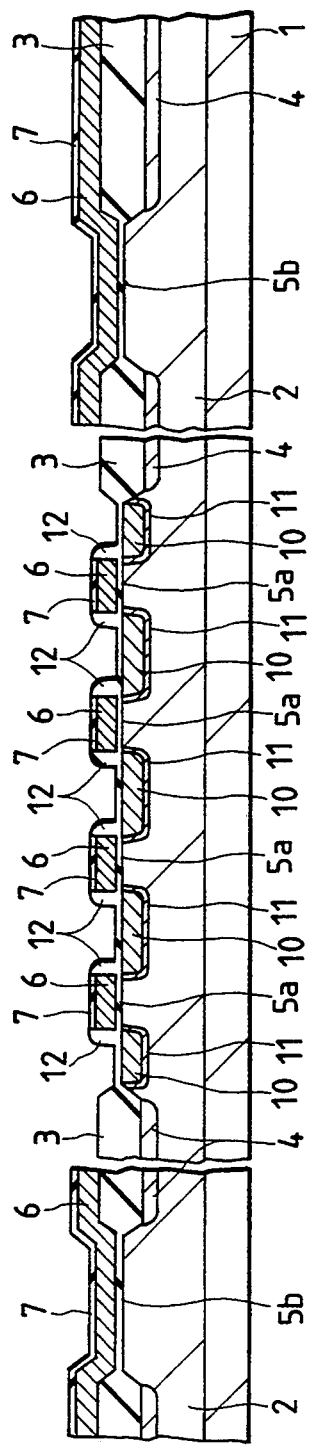
FIG. 18 is a section of the essential portion of the semiconductor substrate and shows the nonvolatile memory manufacturing method according to the embodiment of the present invention.

Next, the silicon oxide film 9 used as the mask for the aforementioned ion implantation and the silicon oxide film 8 on the second gate insulating film 7 are etched off. After this, as shown in FIG. 18, a silicon oxide film 12 having a thickness of about 100 to 300 nm is formed over the n+-buried layer 10 of the memory cell and on the side walls of the first conductor layer 6 by using the thermal oxidation. Simultaneously with this, although not shown, the aforementioned silicon oxide film 12 is also Formed over the n-type semiconductor region of the transfer MISFET and on the side walls of the first conductor layer 6.

Figure 19A:
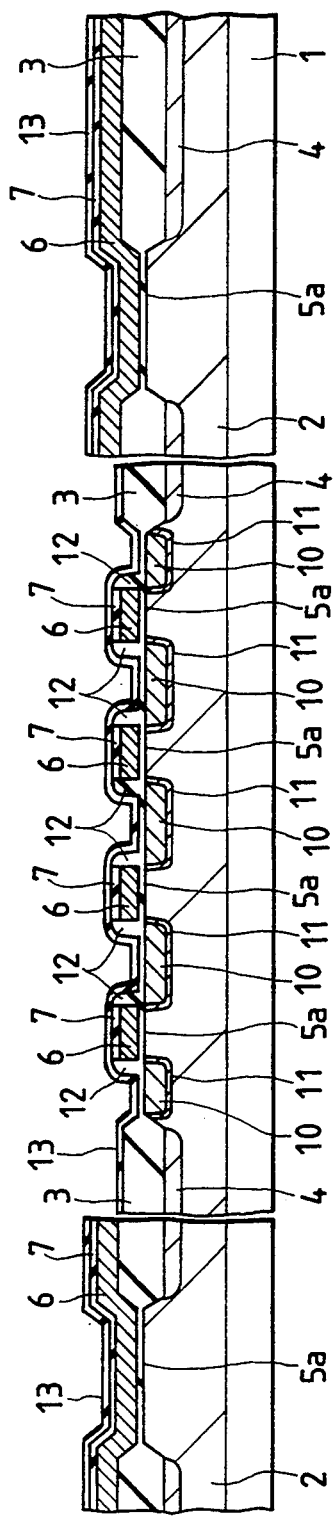
FIGS. 19a and 19b are sections of the essential portion of the semiconductor substrate and show the nonvolatile memory manufacturing method according to the embodiment of the present invention.

Next, as shown in FIG. 19a, a silicon nitride film 13 having a thickness of about 10 to 15 nm is formed all over the semiconductor substrate 1 by the CVD method. This silicon nitride film 13 is used as a mask for etching off the silicon oxide film from the surface of the semiconductor substrate 1 at the peripheral circuit forming region (as located at the lefthand side of FIG. 19a) to form a new gate insulating film for the logic MISFET.

Incidentally, the aforementioned means for depositing the silicon nitride film 13 on the semiconductor substrate 1 may be replaced by another not-shown means. Specifically, the second gate insulating film 7 may be etched off from above the first conductor layer 6. After this, all over the semiconductor substrate 1, there may be deposited either the insulating film having the two layers of silicon oxide and silicon nitride or the insulating film having the four layers of silicon oxide, silicon nitride, silicon oxide and silicon nitride.

Figure 19B:
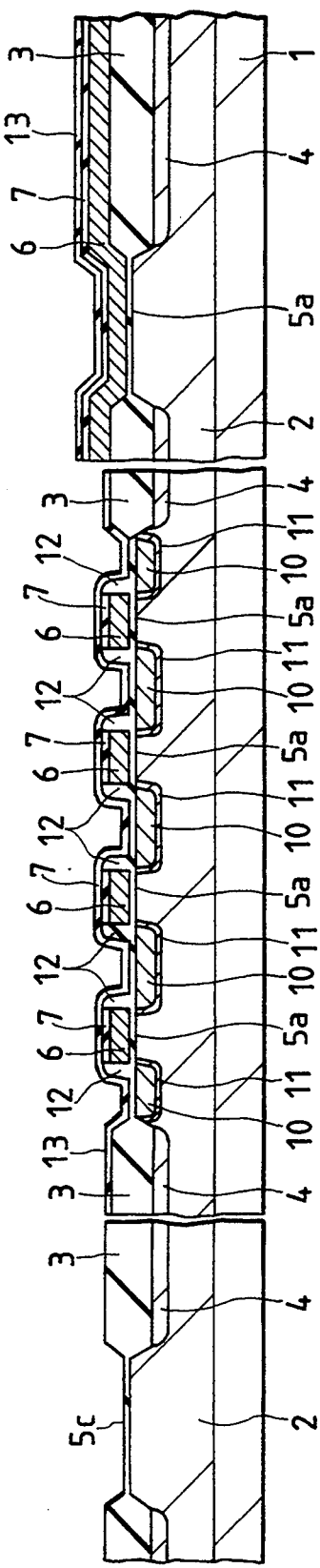

The above-specified insulating film may be used not only as the second gate insulating film of the memory cell but also as the mask for etching off the silicon oxide film from the surface of the semiconductor substrate 1 at the peripheral circuit forming region, like the aforementioned silicon nitride film 13, to form the new gate insulating film of the logic MISFET. Next, as shown in FIG. 19b, the silicon nitride film 13, the second gate insulating film 7, the first conductor layer 6 and the gate insulating film 5b are etched off from the peripheral circuit forming region. After this, a gate insulating film 5c is formed in the peripheral circuit forming region. This gate insulating film 5c is formed to have a thickness of 10 to 15 nm by the thermal oxidation, and the silicon nitride film 13 is used as a mask for forming the gate insulating film 5c.

Figure 15:
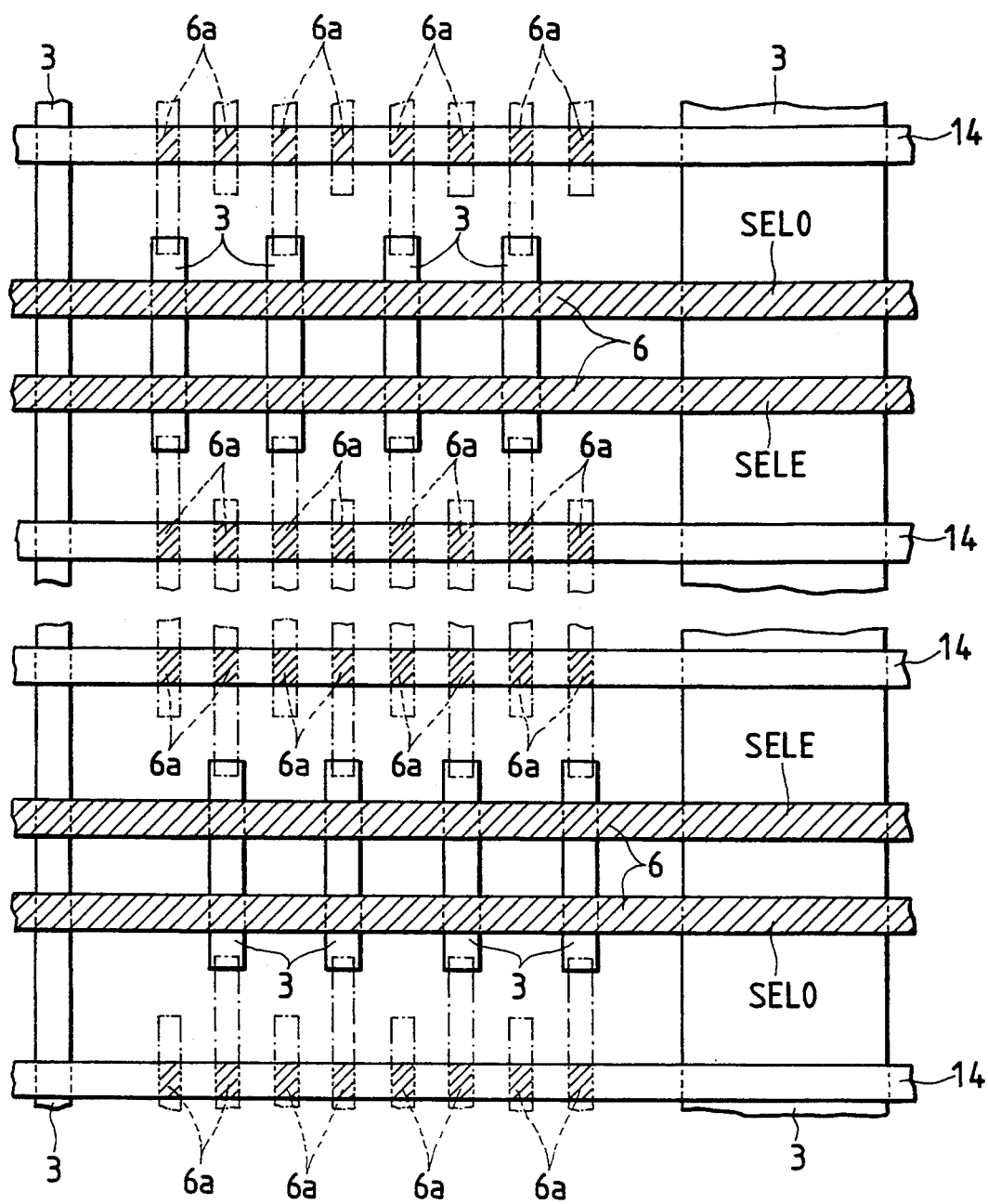
FIG. 15 is a top plan view showing an essential portion of a memory mat and shows the nonvolatile memory manufacturing method according to the embodiment of the present invention.
Figure 20:
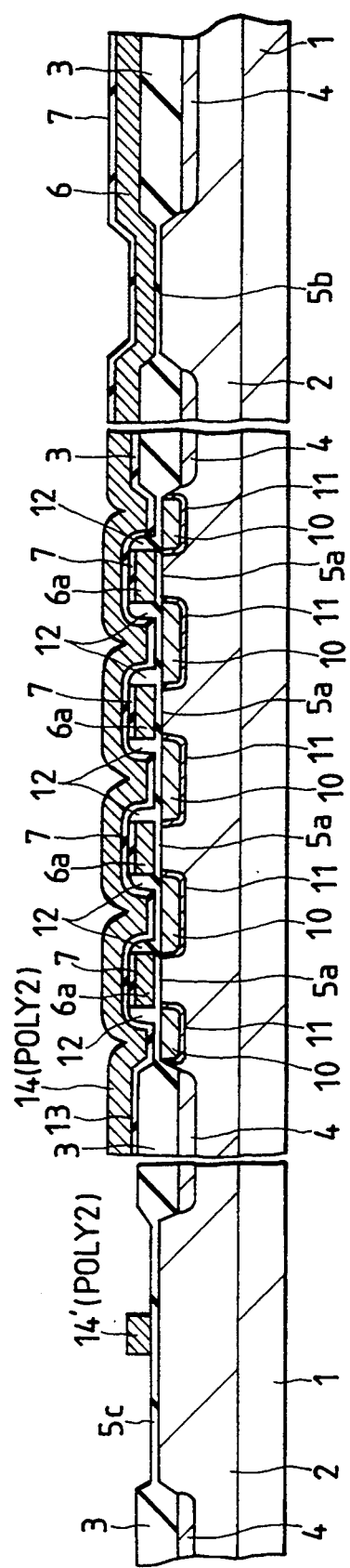
FIG. 20 is a section of the essential portion of the semiconductor substrate and shows the nonvolatile memory manufacturing method according to the embodiment of the present invention.

Next, the second conductor layer is formed all over the semiconductor substrate 1. After this, as shown in FIGS. 20 and 15, the second conductor layer is patterned to form a control gate (or the word line) 14 of the memory cell and a gate electrode 14' of the MISFETs constructing the peripheral circuit. The second conductor layer is made of a polycide film, in which tungsten silicide is laminated over the n-type polycrystalline silicon deposited by the CVD method.

Simultaneously with this, the silicon nitride film 123, the second gate insulating film 7 and the first conductor layer 6 at the memory cell forming region are patterned to form the floating gate 6a, thus completing the MISFETs constructing the memory cell. Incidentally, the first conductor layer 6 thus removed is indicated by single-dotted lines in FIG. 15, and the first conductor layers 6a and 6 left unremoved are hatched in the broken lines.

Next, an n⁻-semiconductor region 100 is formed in self-alignment with the gate electrode 14'. This n⁻-semiconductor region 100 is formed by an ion implantation of phosphorous ions in a dosage of about 1 to $3 \times 10^{13}$ atoms/cm², for example. Next, side walls 102 are formed on the side walls of the gate electrode 14 and the word line. Next, an n⁺-semiconductor region 104 is formed in self-alignment with the side walls 102. The n⁺-semiconductor region 104 is formed by an ion implantation of arsenic ions in a dosage of about 1 to $5 \times 10^{15}$ atoms/cm², for example. The MISFET thus formed with the peripheral circuit is formed to have the LDD (i.e., Lightly Doped Drain) structure.

Figure 21:
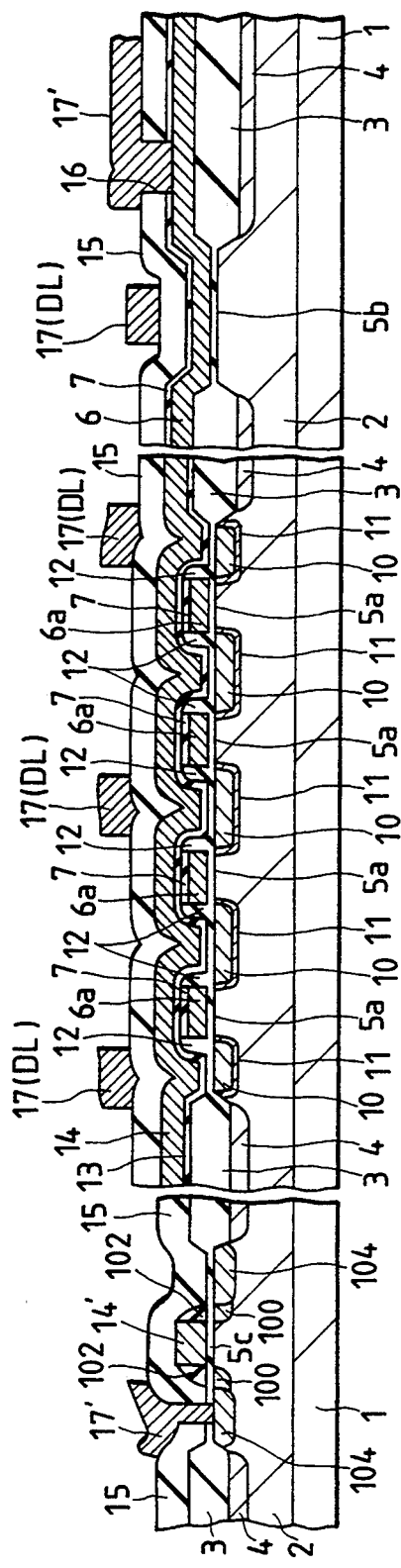
FIG. 21 is a section of the essential portion of the semiconductor substrate and shows the nonvolatile memory manufacturing method according to the embodiment of the present invention.

Next, as shown in FIG. 21, an inter-layer insulating film 15 is formed all over the semiconductor substrate 1 and is opened over both the first conductor layer 5 constructing the gate of the transfer MISFET and the not-shown source and drain of the transfer MISFET to form a contact hole 16. After this, Al wiring lines 17 and 17' are formed over the interlayer insulating film 15. The Al wiring line 17 forms the second data line.

The aforementioned inter-layer insulating film 15 is formed of two layers of the silicon oxide film deposited by the CVD method and the PSG (i.e., Phospho-Silicate Glass) film or the BPSG (i.e., Boron-doped Phospho-Silicate Glass) film. On the other hand, the Al wiring line 17 is formed by patterning the Al-Si-Cu (i.e., aluminum-silicon-copper) alloy film deposited over the inter-layer insulating film 15 by the sputtering method.

Figure 22:
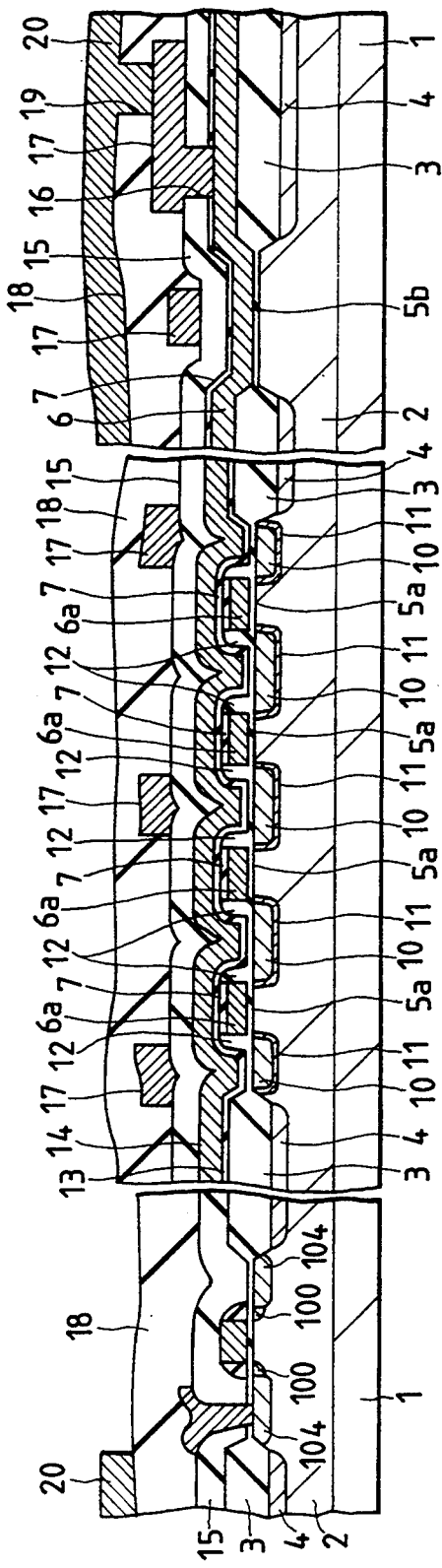
FIG. 22 is a section of the essential portion of the semiconductor substrate and shows the nonvolatile memory manufacturing method according to the embodiment of the present invention.

Next, as shown in FIG. 22, An inter-layer insulating film 18 is formed all over the semiconductor substrate i and is opened above the first conductor layer 6 constructing the gate of the transfer MISFET to form a through hole 19. After this, an Al wiring line 20 is formed over the inter-layer insulating film 18 to shunt the first conductor layer 6 constructing the gate of the transfer MISFET, by the Al wiring line 20 through the Al wiring line 17.

The aforementioned inter-layer insulating film 18 is formed of the three-layered film in which a spin-on glass film is sandwiched between the silicon oxide films deposited by the CVD method. On the other hand, the Al wiring line 20 is formed by patterning the Al-Si-Cu alloy film deposited over the inter-layer insulating film 18 by the sputtering method.

After this, the semiconductor integrated circuit device of the present embodiment is completed by forming the not-shown passivation film all over the semiconductor substrate 1. This passivation film is formed of the laminated film which is prepared by depositing a silicon oxide film and a silicon nitride film by the CVD method.

Figure 23:
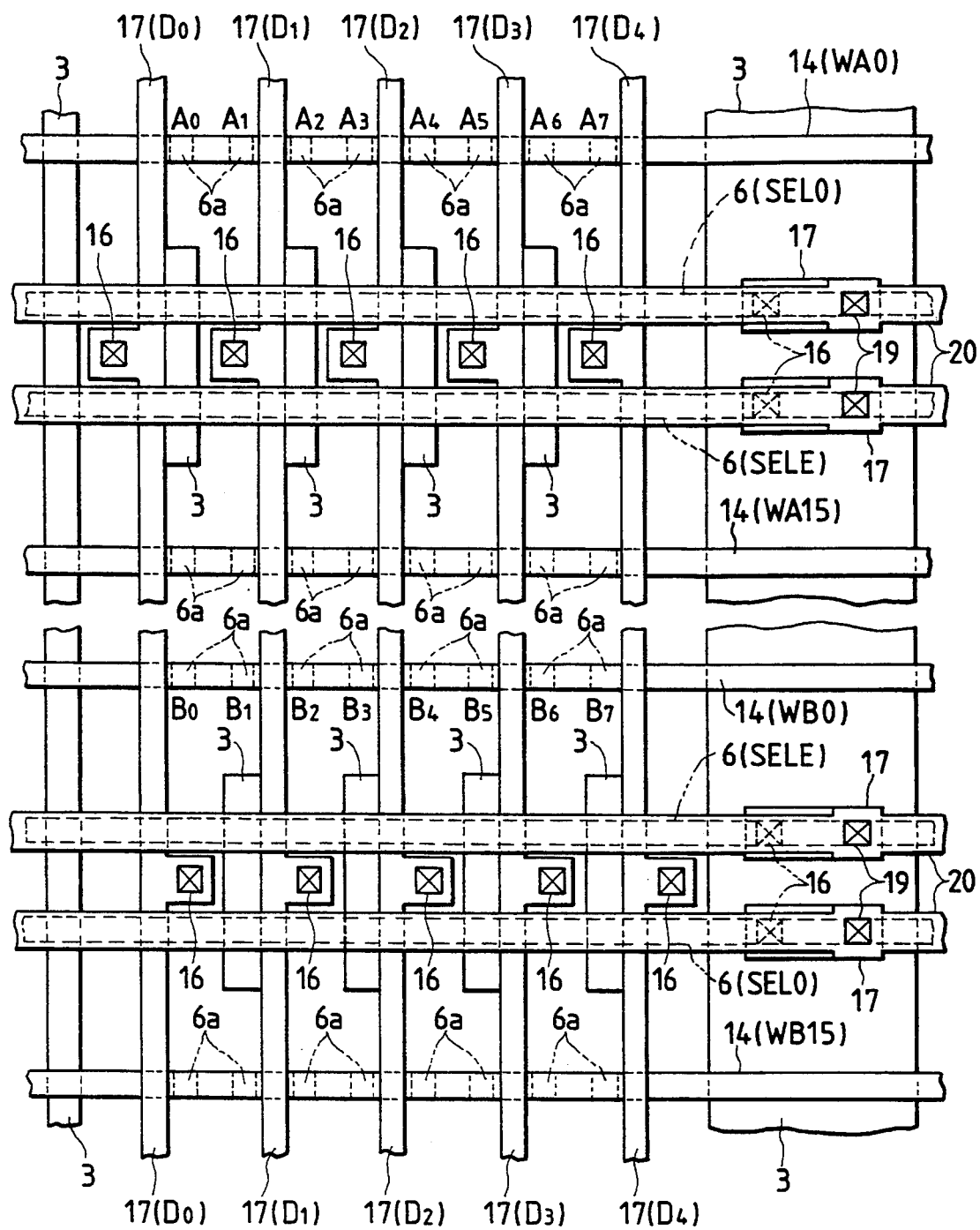
FIG. 23 is a top plan view showing an essential portion of a memory mat and shows the nonvolatile memory manufacturing method according to the embodiment of the present invention.

FIG. 23 is a top plan view showing the semiconductor substrate 1 corresponding to the aforementioned manufacture step of FIG. 22. There are extended along the transverse direction of FIG. 22 the gates (i.e., the first conductor layers 6) of the transfer MISFET, which are overlain by the shunting Al wiring lines 20 in a overlapped manner. These Al wiring lines 20 are connected over the field insulating film 3 at the end portion of the memory array with the gates (i.e., the first conductor layers 6) of the transfer MISFET through the Al wiring lines 20 and the contact holes 16.

Thus, according to the present embodiment, the transfer MISFETs $T_0$ to $T_8$ made of the polycrystalline silicon have their gates shunted by the Al wiring lines 20.

As a result, the gates of the transfer MISFETs $T_0$ to $T_8$ have a lower parasitic resistance ($R_T$) than the parasitic resistance ($R_w$) of the control gates (i.e., the word lines $W_{A0}$ to $W_{A15}$ and $W_{B0}$ to $W_{B15}$) of the memory cells $A_0$ to $A_7$ and $B_0$ to $B_7$ so that the delay time ($T_{TB}$) for the drains of the selected memory cells $A_0$ to $A_7$ and $B_0$ to $B_7$ to reach the selected level "H" is shorter than the delay time ($T_w$) of the word lines $W_{A0}$ to $W_{A15}$ and $W_{B0}$ to $W_{B15}$. As a result, the reading time of the memory cells $A_0$ to $A_7$ and $B_0$ to $B_7$ can be made far shorter than that of the prior art.

The gate width of the transfer MISFETs can be made larger than that of the MISFETs constructing the memory cell. In case the data are to be written in or erased from the memory cell A, the write or erase current is fed to the n⁺-buried layer 10 which is connected with the drain of the memory cell A through the transfer MISFETs $T_0$ to $T_8$. Therefore, the write or erase current becomes the higher for the larger gate width (W) of the transfer MISFETs $T_0$ to $T_8$ so that the writing or erasing efficiency is more improved.

If, however, the gate width (W) of the transfer MISFETs $T_0$ to $T_8$ is increased for the improvement in the writing or erasing efficiency, the gate capacity (i.e., the parasitic capacity $C_T$) is increased to elongate the delay time (i.e., $T_{DB} = C_T \times R_T$), and the reading speed may possibly drop.

In the present embodiment, on the contrary, the parasitic resistance ($R_T$) is reduced by shunting the gates of the transfer MISFETs $T_0$ to $T_8$ through the Al wiring lines 20. As a result, the delay time ($T_{DB}$) can be shortened without deteriorating the writing and erasing efficiencies), to increase the reading speed.

Although our invention has been specifically described in connection with its embodiments, it should not be limited to those embodiments but can naturally be modified in various manners within the scope of the gist thereof.

In the foregoing embodiments, the floating gate of the flash memory and the gate of the transfer MISFETs are formed of the common layer of polycrystalline silicon. Despite this fact, however, the present invention can also be applied to the case, in which the floating gate of the flash memory and the gate of the transfer MISFETs are formed of the common layer of polycide or the case, in which the control gate of the flash memory and the gate of the transfer MISFETs are formed of the common layer of polycrystalline silicon or polycide.

In the foregoing embodiments, there has been described the method of manufacturing the flash memory for erasing the data by the gate negative-bias method. However, the present invention can be applied to a method of manufacturing a flash memory by the substrate positive-bias method in which the data are erased by applying a high potential [$V_{pp}$] to the semiconductor substrate.

The well forming method of the aforementioned cases can be exemplified by: the method ①, in which an n-type semiconductor substrate is used to form a p-well in a memory cell forming region; the method ②, in which a p-type semiconductor substrate is used to form a deep n-well in a memory cell forming region and a p-well in the n-well; and the method ③, in which a p-type semiconductor substrate is used to form a deep n-well and a p-well in the deep n-well in a memory cell forming region.

In the foregoing embodiments, the flash memory and its manufacturing method have been described, but the present invention can also be applied to a EEPROM and its manufacturing method.

The effects to be obtained by a representative of the invention disclosed herein will be briefly described in the following.

(1) By shunting the gate of the transfer MISFET, which is made of the same conductive material as that of the control gate or floating gate of the nonvolatile memory, by the wiring line which is made of a conductive material having a lower resistance than the aforementioned conductive material, the parasitic resistance of the gate of the transfer MISFET can be made lower than that of the control gate (or the word line) of the nonvolatile memory so that the reading time of the nonvolatile memory can be shortened.

(2) Since the semiconductor region is formed in self-alignment with the first conductor layer constructing the floating gate of the nonvolatile memory, the memory cell size can be miniaturized more than the prior art which is required to have a matching allowance between the photo mask used for forming the semiconductor region and the photo mask for forming the floating gate.

(3) When the semiconductor region is formed by the ion implantation, the silicon oxide film is formed over the silicon nitride film constructing a portion of the second gate insulating film of the nonvolatile memory. As a result, the silicon nitride film can be prevented from being damaged by the ion implantation thereby to prevent the second gate insulating film from being deteriorated.

What is claimed is:

1. A method of manufacturing a nonvolatile memory including a memory cell having a single MISFET, comprising the steps of:
    forming a first gate insulating film over a principal surface of a semiconductor substrate;
    forming a first conductor layer over said first gate insulating film;
    forming a second gate insulating film over said first conductor layer;
    forming a damage preventing film over said second gate insulating film;
    patterning said damage preventing film, said second gate insulating film and said first conductor layer in a stripe shape to extend in a first direction;
    forming semiconductor regions, in self-alignment with said first conductor layer in a stripe shape, extending in said first direction, in said semiconductor substrate, at both sides of the damage preventing film, second gate insulating film and first conductor layer patterned in the stripe shape, by ion implantation of ions of a first impurity, by using said stripe-shaped damage preventing film as a mask, wherein said damage preventing film acts to prevent said second gate insulating film from being implanted with said first impurity;
    after forming the semiconductor regions, removing said damage preventing film, without removing said second gate insulating film;
    forming a second conductor layer over said second gate insulating film and over said principal surface after said damage preventing film has been removed; and
    forming the control gate electrode and floating gate electrode of said MISFET by etching said second conductor layer, said second gate insulating film and said first conductor layer selectively,
    wherein one of said semiconductor regions acts as a first data line and is formed integrally with the source or drain region of said MISFET.

2. A method according to claim 1,
    wherein said semiconductor regions extend in said first direction, and
    wherein said second conductor layer constructing said control gate electrode is formed integrally with a word line and extends in a second direction perpendicular to said first direction.

3. A method according to claim 1, wherein the semiconductor regions form source and drain regions of the MISFET.

4. A method according to claim 1, wherein the second gate insulating film includes a silicon oxide film and a silicon nitride film over the silicon oxide film.

5. A method according to claim 1, wherein the damage preventing film is formed of silicon oxide, and is formed by chemical vapor deposition.

6. A method according to claim 5, wherein the damage preventing film has a thickness of 50–100 nm.

7. A method according to claim 1, comprising the further step of forming a further silicon oxide film over the semiconductor substrate including over the damage preventing film, after said patterning and prior to said forming semiconductor regions, said further silicon oxide film acting as a mask in forming the semiconductor regions.

8. A method according to claim 1, wherein the second conductor layer is made of a polycide film.

9. A method of manufacturing a semiconductor memory device including memory cells, comprising the steps of:
    forming a first gate insulating film over a main surface of a semiconductor substrate;
    forming a first conductive film over said first gate insulating film;
    forming a second gate insulating film over said first conductive film;
    forming a damage preventing film over said second gate insulating film;
    patterning said damage preventing film, said second gate insulating film and said first conductive film in a stripe shape in such a manner that said damage preventing film, said second gate insulating film and said first conductive film are left on first regions of said main surface and in such a manner that said damage preventing film, said second gate insulating film and said first conductive film are removed from second regions of said main surface, wherein said first and second regions extend in a first direction, side by side in such a manner that a first region is formed between adjacent second regions and in such a manner that a second region is formed between adjacent first regions;
    introducing an impurity within each of said second regions in self-alignment with said damage preventing film with said stripe shape to form first semiconductor regions in said semiconductor substrate below said second regions, wherein said first semiconductor regions extend below said second regions adjacent to each other in said second direction and are formed in self-alignment with said first conductive film in a stride shape, and wherein said damage preventing film acts to prevent said second gate insulating film from being introduced with said impurity;

removing said damage preventing film with said stripe shape, after introducing the impurity;

forming a first insulating film over both side surfaces of said first conductive films with said stripe shape and over said second regions;

forming a second conductive film over said first insulating film and over said second gate insulating film with said stripe shape; and patterning said second conductive film and said first conductive film with said stripe shape to form word lines and floating gate electrodes, respectively, wherein said word lines extend in said second direction and are spaced apart from each other in said first direction, wherein said floating gate electrodes are formed below said word lines and are spaced apart from each other in said first direction, wherein each of the memory cells is comprised of a single MISFET including said first gate insulating film, said floating gate electrode, said second gate insulating film, a control gate electrode and said first semiconductor regions serving as source and drain regions of said MISFET, wherein said memory cells are arranged in said first and second directions in such a manner that said first semiconductor regions are common for memory cells adjacent to each other in said second direction and in such a manner that said first semiconductor regions are common for said memory cells arranged in said first direction.

10. A method of manufacturing a semiconductor memory device according to claim 9, further comprising the step of forming a second insulating film over said first insulating film and over said second gate insulating film with said stripe shape, by chemical vapor deposition, and wherein said second conductive film is formed over said second insulating film.

11. A method of manufacturing a semiconductor memory device according to claim 10, wherein said second insulating film is a silicon nitride film.

12. A method according to claim 9, wherein said damage preventing film is formed of a silicon oxide film.

13. A method according to claim 12, wherein said second gate insulating film is formed of a two-layered film consists of a silicon oxide layer and a silicon nitride layer.

* * * * *